United States Patent
Park et al.

(10) Patent No.: US 9,214,411 B2
(45) Date of Patent: Dec. 15, 2015

(54) INTEGRATED CIRCUIT DEVICES INCLUDING A THROUGH-SILICON VIA STRUCTURE AND METHODS OF FABRICATING THE SAME

(71) Applicants: Jae-Hwa Park, Yongin-si (KR); Kwang-jin Moon, Hwaseong-si (KR); Suk-Chul Bang, Yongin-si (KR); Byung-Iyul Park, Seoul (KR); Jeong-gi Jin, Osan-si (KR); Tae-seong Kim, Suwon-si (KR); Sung-hee Kang, Seongnam-si (KR)

(72) Inventors: Jae-Hwa Park, Yongin-si (KR); Kwang-jin Moon, Hwaseong-si (KR); Suk-Chul Bang, Yongin-si (KR); Byung-Iyul Park, Seoul (KR); Jeong-gi Jin, Osan-si (KR); Tae-seong Kim, Suwon-si (KR); Sung-hee Kang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/506,930

(22) Filed: Oct. 6, 2014

(65) Prior Publication Data

US 2015/0102497 A1     Apr. 16, 2015

(30) Foreign Application Priority Data

Oct. 15, 2013    (KR) .......................... 10-2013-0122956

(51) Int. Cl.
*H01L 29/40* (2006.01)
*H01L 23/48* (2006.01)
*H01L 23/485* (2006.01)
*H01L 23/50* (2006.01)
*H01L 21/768* (2006.01)
*H01L 23/498* (2006.01)
(Continued)

(52) U.S. Cl.
CPC ........ *H01L 23/481* (2013.01); *H01L 21/76802* (2013.01); *H01L 21/76877* (2013.01); *H01L 21/76898* (2013.01); *H01L 23/485* (2013.01); *H01L 23/50* (2013.01); *H01L 23/4985* (2013.01); *H01L 23/49827* (2013.01); *H01L 25/0657* (2013.01); *H01L 25/18* (2013.01); *H01L 2224/16145* (2013.01); *H01L 2225/06513* (2013.01); *H01L 2225/06517* (2013.01); *H01L 2225/06541* (2013.01); *H01L 2924/1431* (2013.01); *H01L 2924/1436* (2013.01); *H01L 2924/1437* (2013.01); *H01L 2924/14511* (2013.01)

(58) Field of Classification Search
USPC .................. 257/621, 774, E21.577, E21.578, 257/E21.585–E21.588, E21.597, 777, 780, 257/781, E25.006
See application file for complete search history.

(56) References Cited

U.S. PATENT DOCUMENTS 7,786,584 B2   8/2010   Barth et al.
8,053,900 B2   11/2011  Yu et al.
(Continued)

FOREIGN PATENT DOCUMENTS

JP        2010-073889        4/2010

*Primary Examiner* — Jasmine Clark
(74) *Attorney, Agent, or Firm* — Myers Bigel Sibley & Sajovec

(57) ABSTRACT

Integrated circuit (IC) devices are provided including: a first multi-layer wiring structure including a plurality of first wiring layers in a first region of a substrate at different levels and spaced apart from one another, and a plurality of first contact plugs between the plurality of first wiring layers and connected to the plurality of first wiring layers; a through-silicon via (TSV) landing pad including a first pad layer in a second region of the substrate at a same level as that of at least one first wiring layer from among the plurality of first wiring layers, and a second pad layer at a same level as that of at least one first contact plug from among the plurality of first contact plugs and contacts the first pad layer; a second multi-layer wiring structure on the TSV landing pad; and a TSV structure that passes through the substrate and is connected to the second multi-layer wiring structure through the TSV landing pad.

15 Claims, 23 Drawing Sheets

(51) Int. Cl.
   *H01L 25/065* (2006.01)
   *H01L 25/18* (2006.01)

(56) References Cited

U.S. PATENT DOCUMENTS

| | | |
|---|---|---|
| 8,247,906 B2 | 8/2012 | Law et al. |
| 8,338,289 B2 | 12/2012 | Murayama et al. |
| 8,350,389 B2 * | 1/2013 | Itaya et al. .................... 257/774 |
| 8,404,587 B2 | 3/2013 | Kirby et al. |
| 8,431,421 B2 | 4/2013 | Chen |
| 9,018,768 B2 * | 4/2015 | Park et al. .................... 257/774 |
| 2009/0283871 A1 | 11/2009 | Chang et al. |
| 2010/0102454 A1 | 4/2010 | Akiyama |
| 2010/0225002 A1 | 9/2010 | Law et al. |
| 2011/0254165 A1 * | 10/2011 | Muranaka .................... 257/751 |
| 2012/0315758 A1 | 12/2012 | Sakurai et al. |
| 2013/0015504 A1 | 1/2013 | Kuo et al. |

* cited by examiner

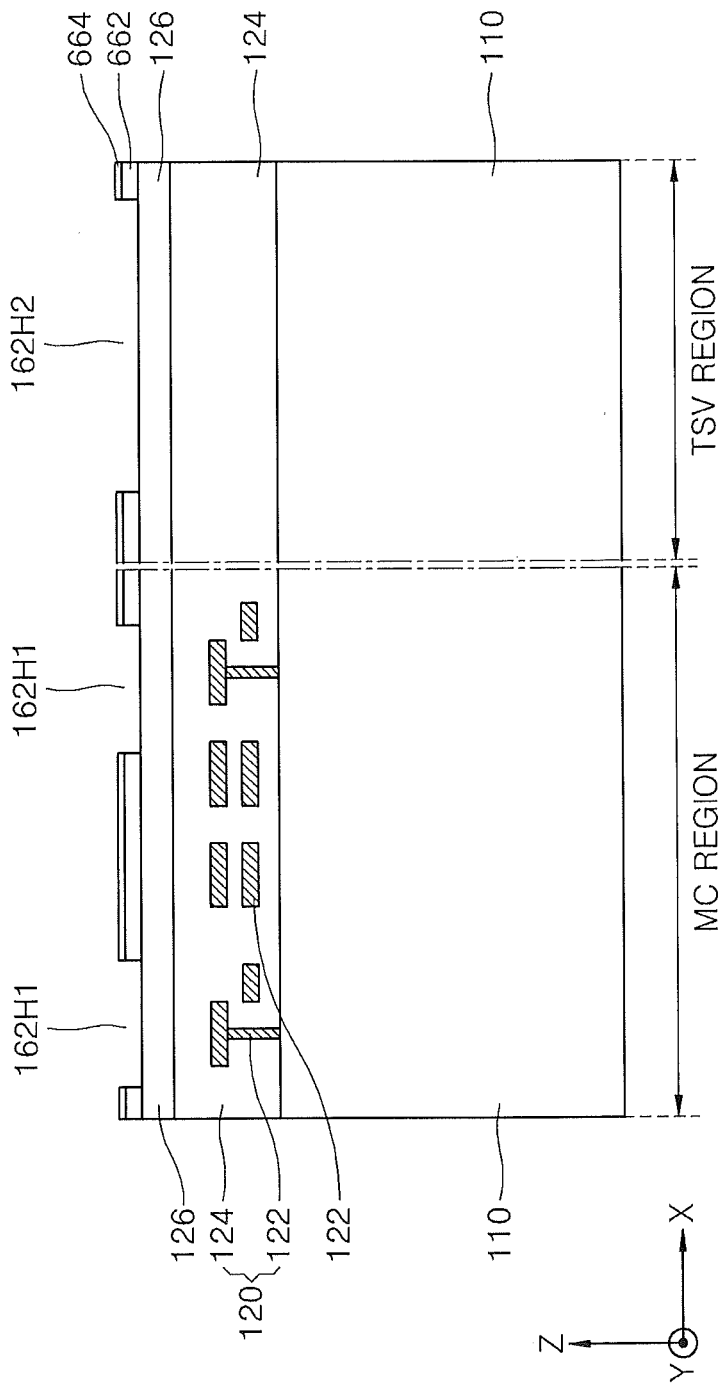

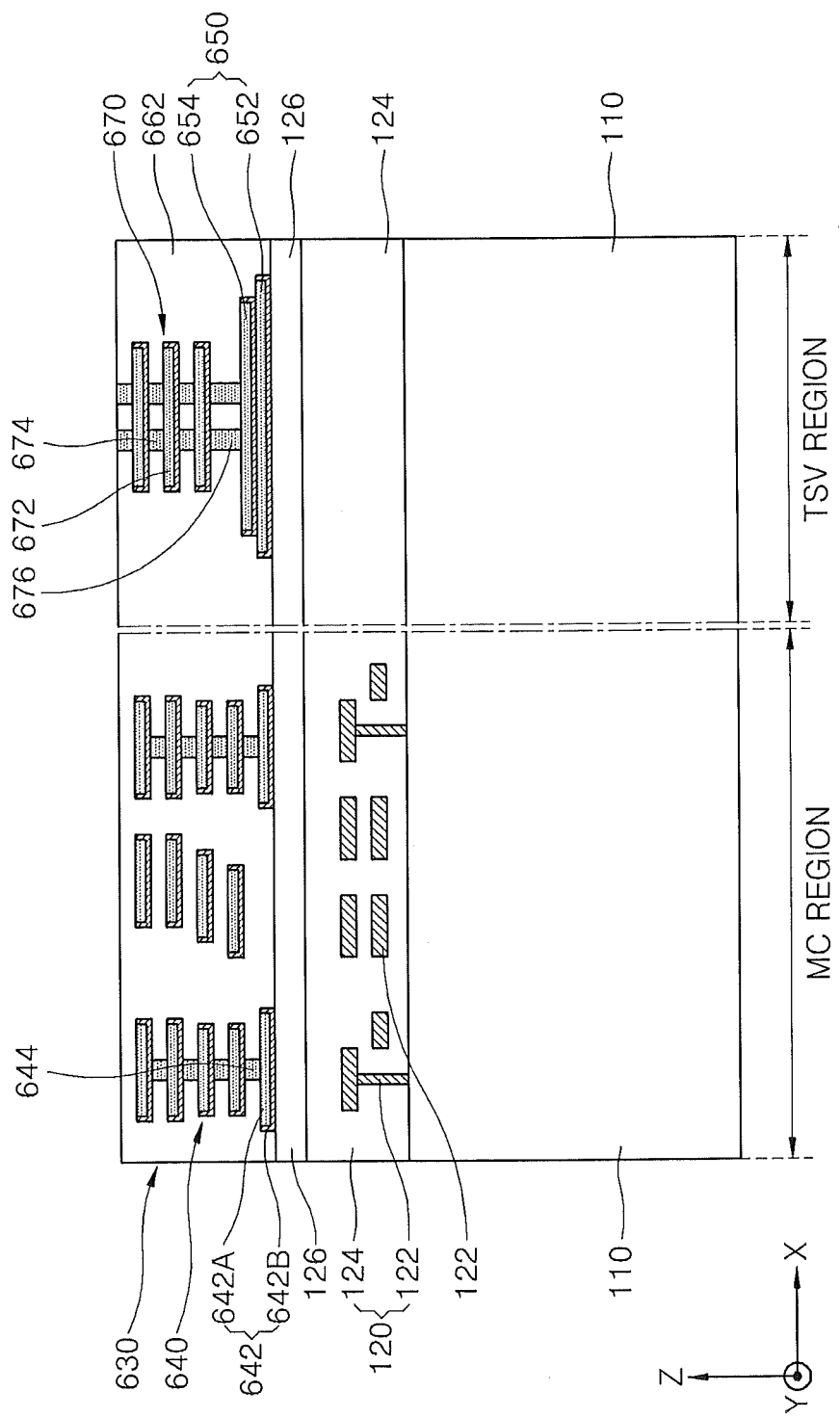

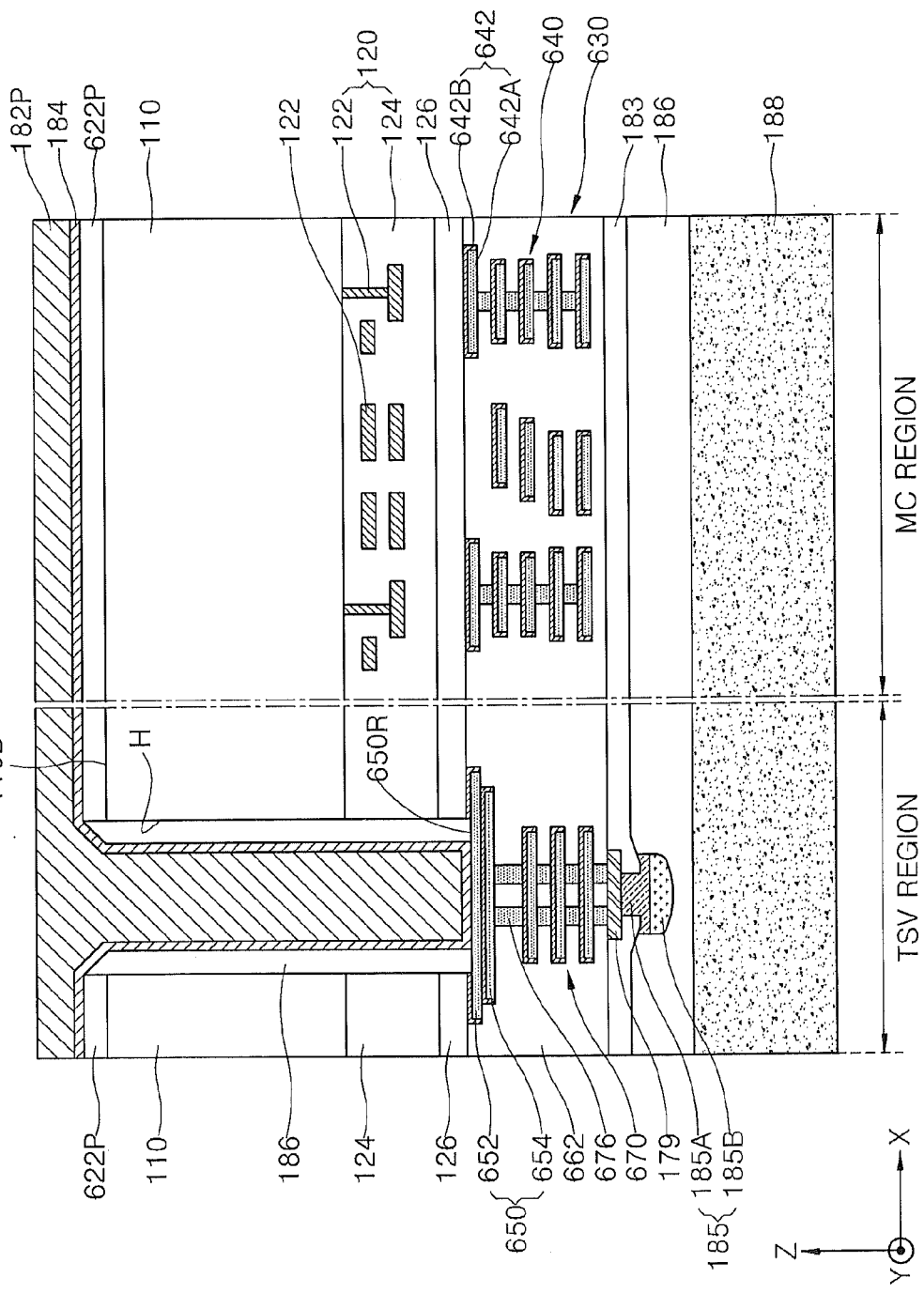

INTEGRATED CIRCUIT DEVICES INCLUDING A THROUGH-SILICON VIA STRUCTURE AND METHODS OF FABRICATING THE SAME

CROSS-REFERENCE TO RELATED APPLICATIONS

This application claims the benefit of Korean Patent Application No. 10-2013-0122956, filed Oct. 15, 2013, in the Korean Intellectual Property Office, the disclosure of which is hereby incorporated herein by reference as if set forth in its entirety.

FIELD

The inventive concept relates generally to integrated circuit (IC) devices and methods of manufacturing the same and, more particularly, to IC devices including a through-silicon via (TSV) structure and methods of manufacturing the same.

BACKGROUND

As a three-dimensional (3D) package configured such that a plurality of semiconductor chips are mounted on one semiconductor package has been actively developed, a through-silicon via (TSV) that is a vertical electrical connection passing through a substrate or a die has been considered very important. There is a demand for a technology for forming a device having stable operation and high reliability in a TSV structure in order to improve the performance and reliability of a 3D package.

SUMMARY

Some embodiments of the present inventive concept provide integrated circuit (IC) devices including: a first multi-layer wiring structure including a plurality of first wiring layers in a first region of a substrate at different levels and spaced apart from one another, and a plurality of first contact plugs between the plurality of first wiring layers and connected to the plurality of first wiring layers; a through-silicon via (TSV) landing pad including a first pad layer in a second region of the substrate at a same level as that of at least one first wiring layer from among the plurality of first wiring layers, and a second pad layer at a same level as that of at least one first contact plug from among the plurality of first contact plugs and contacts the first pad layer; a second multi-layer wiring structure on the TSV landing pad; and a TSV structure that passes through the substrate and is connected to the second multi-layer wiring structure through the TSV landing pad.

In further embodiments, a width of the second pad layer in a direction parallel to a main surface extension direction of the substrate may be greater than a width of the at least one first contact plug.

In still further embodiments, a width of the first pad layer and a width of the second pad layer in a direction parallel to a main surface extension direction of the substrate may be different from each other.

In some embodiments, each of the first pad layer and the second pad layer may include a metal layer, and a conductive barrier film that surrounds at least a part of the metal layer. The TSV landing pad may further include a third pad layer that is connected to the second pad layer to vertically overlap with the first pad layer and is formed at a same level as that of any one first wiring layer from among the plurality of first wiring layers.

In further embodiments, a width of the third pad layer in a direction parallel to a main surface extension direction of the substrate may be less than a width of the second pad layer. The third pad layer may include a metal layer, and a conductive barrier film that surrounds at least a part of the metal layer.

In still further embodiments, the IC device may further include an insulating film in the second region between the substrate and the TSV landing pad, wherein the TSV structure passes through the substrate and the insulating film and is connected to the TSV landing pad.

In some embodiments, the TSV landing pad may extend in the second region of the substrate in a first area, wherein the TSV structure is connected in the second region of the substrate to the TSV landing pad in a second area that is included in the first area.

In further embodiments, the TSV structure may have a top surface that contacts the TSV landing pad, wherein only a portion of the top surface contacts the TSV landing pad.

In still further embodiments, at least a portion of the TSV landing pad may have a mesh pattern. At least a portion of the TSV landing pad may have a plurality of patterns that are spaced apart from one another.

In some embodiments, the second multi-layer wiring structure may include: a plurality of second wiring layers at different levels and are spaced apart from one another; and a plurality of second contact plugs connected from any one second wiring layer from among the plurality of second wiring layers to the TSV landing pad and are spaced apart from one another.

Further embodiments of the present inventive concept provide an integrated circuit (IC) device including: a substrate including a memory cell array region and a through-silicon via (TSV) region; a multi-layer wiring structure on the substrate in the memory cell array region; a TSV landing pad that has a multi-layer structure and is on the substrate in the TSV region; and a TSV structure that passes through the substrate in the TSV region and is connected to the TSV landing pad, wherein the multi-layer wiring structure includes a plurality of first wiring layers that are spaced apart from one another to vertically overlap with one another, and a plurality of contact plugs that are disposed between the plurality of first wiring layers and connect the plurality of first wiring layers, and wherein the TSV landing pad includes a first pad layer that is formed on the substrate at a same level as that of at least one wiring layer from among the plurality of wiring layers, and a second pad layer that is formed at a same level as that of at least one contact plug from among the plurality of contact plugs and contacts the first pad layer.

In still further embodiments, each of the first pad layer and the second pad layer may have a width that is greater than a width of the TSV structure in a direction parallel to a main surface extension direction of the substrate.

Some embodiments of the present inventive concept methods of fabricating integrated circuits (ICs), the method including: simultaneously forming a first wiring layer on a substrate in a first region, and a first pad layer that is a first portion of a through-silicon via (TSV) landing pad on the substrate in a second region; simultaneously forming a first contact plug on the substrate in the first region at a level different from that of the first wiring layer, and a second pad layer that is a second portion of the TSV landing pad and is connected on the first pad layer to the first pad layer; and forming a TSV structure that passes through the substrate in the second region and is connected to the TSV landing pad.

In further embodiments, in a direction parallel to a main surface extension surface of the substrate, a width of the first contact plug may be less than a width of the first wiring layer, and a width of the second pad layer is greater than a width of the first contact plug.

In still further embodiments, the first pad layer and the second pad layer may have different widths in a direction parallel to a main surface extension direction of the substrate.

In some embodiments, the method may further include simultaneously forming a second wiring layer that is disposed on the substrate in the first region at a level different from those of the first wiring layer and the first contact plug, and a third pad layer that is a third portion of the TSV landing pad, wherein the third pad layer is connected to the second pad layer on the second pad layer.

In further embodiments, the first pad layer, the second pad layer, and the third pad layer may be formed to have widths that increase toward the substrate in a direction parallel to a main surface extension direction of the substrate.

In still further embodiments, the simultaneous forming of the first wiring layer and the first pad layer may include: forming on the substrate an insulating pattern that has a first hole formed in the first region and a second hole formed in the second region; forming a first conductive layer that includes a first buried portion that is disposed in the first hole, and a second buried portion that is disposed in the second hole; and forming the first wiring layer that is formed of the first buried portion of the first conductive layer, and the first pad layer that is formed of the second buried portion of the first conductive layer.

In some embodiments, the first contact plug may be formed to contact the first wiring layer.

In further embodiments, forming of the TSV structure may include: forming a via hole through which the first pad layer is exposed by etching a part of the substrate; and forming the TSV structure that is connected to the first pad layer in the via hole.

Still further embodiments of the present inventive concept provide a method of fabricating an integrated circuit (IC) device, the method including: forming in a first region of a substrate a multi-layer wiring structure that includes a plurality of wiring layers, and a plurality of contact plugs for connecting the plurality of wiring layers; forming a through-silicon via (TSV) landing pad having a multi-layer structure that is formed in a second region of the substrate at a same level as those of at least two layers from among the plurality of wiring layers and the plurality of contact plugs that have different distances from the substrate, and is formed of a same material as that of the at least two layers; and forming a TSV structure that passes through the substrate in the second region and is connected to the TSV landing pad.

In some embodiments, at least a part of the TSV landing pad may be formed to have a mesh pattern or a plurality of patterns that are spaced apart from one another.

BRIEF DESCRIPTION OF THE DRAWINGS

Exemplary embodiments of the inventive concept will be more clearly understood from the following detailed description taken in conjunction with the accompanying drawings in which:

FIGS. 6A through 6L are cross-sections illustrating processing steps in the fabrication of an IC device according to some embodiments of the inventive concept.

DETAILED DESCRIPTION OF THE EMBODIMENTS

Figure 1:
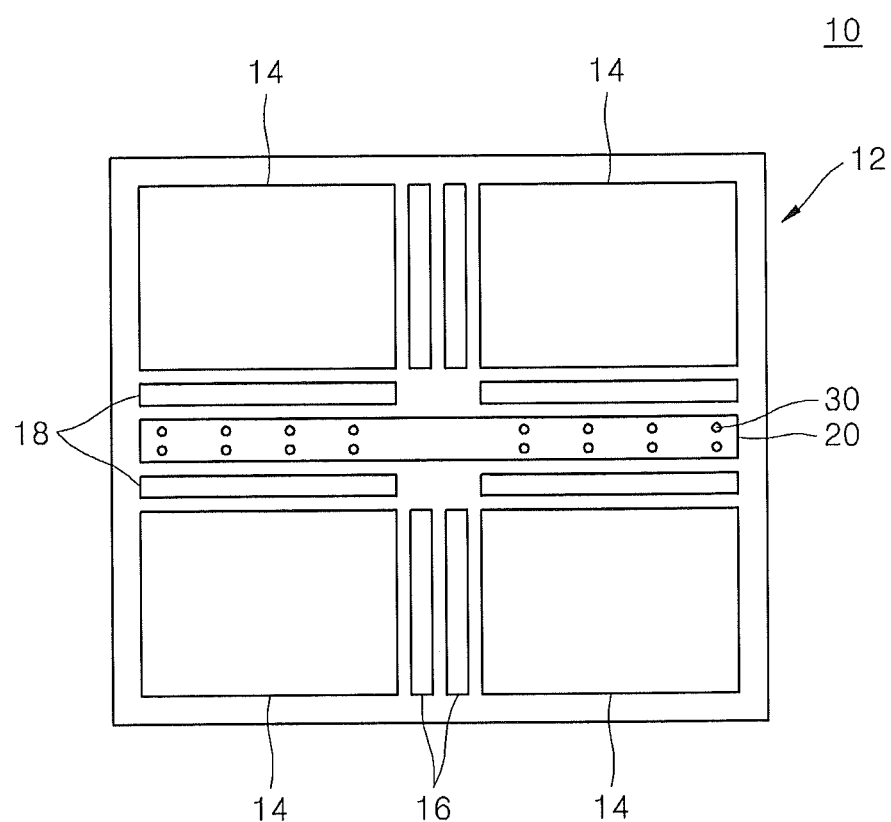
FIG. 1 is a plan view illustrating an integrated circuit (IC) device according to some embodiments of the inventive concept.

Advantages and features of the present inventive concept and methods of accomplishing the same may be understood more readily by reference to the following detailed description of embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The present inventive concept will be described with reference to perspective views, cross sections, and/or plan views, in which embodiments of the inventive concept are shown. Thus, the profile of an exemplary view may be modified according to manufacturing techniques and/or allowances. That is, the embodiments of the inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illuminate the inventive concept and is not a limitation on the scope of the inventive concept unless otherwise specified. Further, unless defined otherwise, all terms defined in generally used dictionaries may not be overly interpreted.

When a certain embodiment may be implemented differently, a specific process order may be performed differently from the described order. For example, two consecutively described processes may be performed substantially at the same time or performed in an order opposite to the described order.

As such, variations from the shapes of the illustrations as a result, for example, of manufacturing techniques and/or tolerances, are to be expected. Thus, the exemplary embodiments should not be construed as limited to the particular shapes of regions illustrated herein but may be to include deviations in shapes that result, for example, from manufacturing.

Referring first to FIG. 1, a plan view illustrating an integrated circuit (IC) device 10 according to some embodiments of the inventive concept will be discussed. As illustrated in FIG. 1, a memory chip 12 of the IC device 10 includes a plurality of memory blocks 14. A plurality of memory cells is disposed on the plurality of memory blocks 14. A plurality of word lines, a plurality of bit lines, and a sense amplifier may be disposed in various ways on the plurality of memory blocks 14. A plurality of column decoders 16, a plurality of row decoders 18, and a through-silicon via (TSV) region 20 are disposed around the plurality of memory blocks 14. The plurality of column decoders 16 may receive addresses, may decode the addresses, and may select column lines of the memory blocks 14. The plurality of row decoders 18 may receive addresses, may decode the addresses, and may output row addresses for selecting row lines of the memory blocks 14. The memory chip 12 may further include a write driver, an input/output sense amplifier, and an input/output buffer. The input/output buffer of the memory chip 12 may receive a signal from the outside through a TSV structure 30, or may transmit a signal to the outside through the TSV structure 30.

The TSV region 20 may be located at a substantially central portion of the memory chip 12. A plurality of the TSV structures 30 may be disposed in the TSV region 20.

Figure 2A:
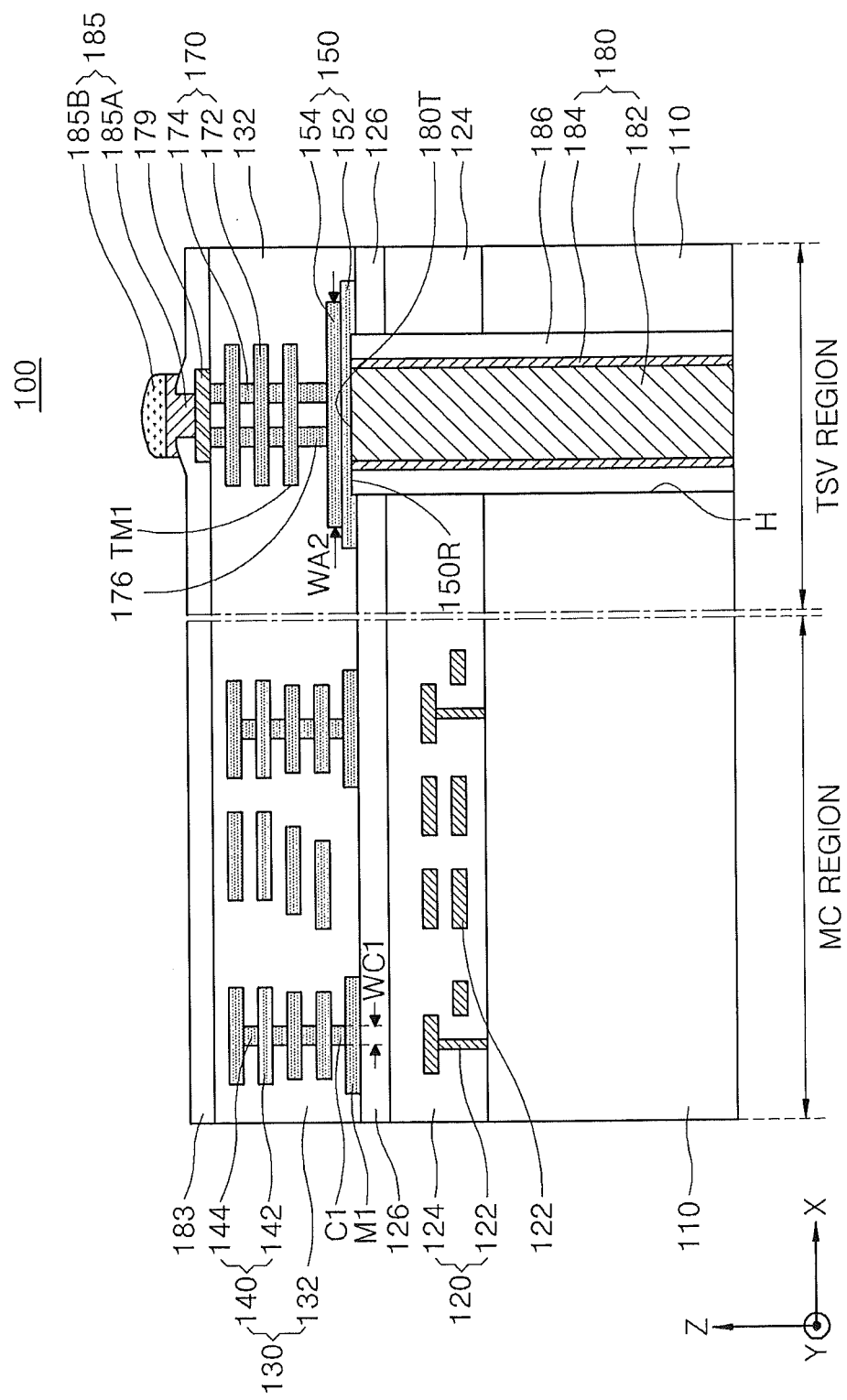
FIG. 2A is a cross-section of the IC device according to some embodiments of the inventive concept.

Referring to FIG. 2A, a cross-section of the IC device 100 according to some embodiments of the inventive concept with be discussed. As illustrated in FIG. 2A, a substrate 110 of the IC device 100 includes a memory cell array region (hereinafter, referred to as an "MC region") whose pattern density is relatively high, and a TSV region whose pattern density is lower than that of the MC region.

The MC region of FIG. 2A may correspond to some elements of the plurality of memory blocks 14 of FIG. 1. The TSV region of FIG. 2A may correspond to some elements of the TSV region 20 of FIG. 1.

In some embodiments, the substrate 110 is a semiconductor wafer. In some embodiments, the substrate 110 includes silicon (Si). The substrate 110 may also include a semiconductor element such as germanium (Ge), or a compound semiconductor such as silicon carbide (SiC), gallium arsenide (GaAs), indium arsenide (InAs), or indium phosphide (InP) without departing from the scope of the present inventive concept. In some embodiments, the substrate 110 may have a silicon on insulator (SOI) structure. For example, the substrate 110 may include a buried oxide (BOX) layer. In some embodiments, the substrate 110 may include a conductive region, for example, a region well doped with impurities or a structure doped with impurities. Furthermore, the substrate 110 may have any of various device isolation structures such as a shallow trench isolation (STI) structure.

A front-end-of-line (FEOL) structure 120 is formed on the substrate 110.

The FEOL structure 120 includes a plurality of individual devices 122 that are of various types, and an interlayer insulating film 124. The plurality of individual devices 122 may include various microelectronic devices, such as a metal-oxide-semiconductor field effect transistor (MOSFET), a complementary metal-insulator-semiconductor (CMOS) transistor, a large scale integration (LSI) system, an image sensor such as a CMOS imaging sensor (CIS), a micro-electro-mechanical system (MEMS), an active device, and a passive device. The plurality of individual devices 122 may be electrically connected to the conductive region of the substrate 110. Furthermore, the plurality of individual devices 122 may be electrically isolated from one another due to the interlayer insulating film 124.

An etch-stop layer 126 is formed on the FEOL structure 120. In some embodiments, the interlayer insulating film 124 is an oxide film and the etch-stop layer 126 is formed of a nitride film, however, embodiments of the present inventive concept are not limited thereto.

In the MC region, a back-end-of-line (BEOL) structure 130 is formed on the etch-stop layer 126 that is formed on the FEOL structure 120. The BEOL structure 130 includes an intermetal insulating film 132 and a plurality of first multi-layer wiring structures 140. The plurality of first multi-layer wiring structures 140 include a plurality of first wiring layers 142 that are spaced apart from one another to vertically overlap with one another, and a plurality of first contact plugs 144 that are disposed between the plurality of first wiring layers 142 and connect the plurality of first wiring layers 142.

In the TSV region, a TSV landing pad 150 having a multi-layer structure is formed on the etch-stop layer 126 that is formed on the FEOL structure 120.

The TSV landing pad 150 has a multi-layer structure that is formed on the substrate 110 at the same level as those of at least two layers selected from the plurality of first wiring layers 142, the plurality of first contact plugs 144, or a combination thereof that have different distances from the substrate 110 from among the first multi-layer wiring structures 140, and is formed of the same material as those of the at least two layers.

FIG. 2A illustrates a case where the TSV landing pad 150 includes a first pad layer 152 that is formed at the same level as that of any one first wiring layer 142 from among the plurality of first wiring layers 142 constituting the plurality of first multi-layer wiring structures 140, and a second pad layer 154 that is formed at the same level as that of at least one first contact plug 144 from among the plurality of first contact plugs 144 and contacts the first pad layer 152. Furthermore, FIG. 2A illustrates that the TSV landing pad 150 has a two-layer structure including the first pad layer 152 and the second pad layer 154, the first pad layer 152 is formed at the same level as that of a first wiring layer M1 that is formed at a lowest level from among the plurality of first wiring layers 142 that are formed in the MC region, and the second pad layer 154 is formed at the same level as that of a first contact plug C1 that is directly formed on the first wiring layer M1 that is formed at a lowest level from among the plurality of first contact plugs 144 that are formed in the MC region.

However, the inventive concept is not limited thereto. For example, the TSV landing pad 150 may have a multi-layer structure in which at least three conductive layers are sequentially stacked, which will be discussed further below with respect to FIGS. 3A, 5A, and 5B.

Referring now to FIG. 2A, as illustrated therein the first pad layer 152 and the second pad layer 154 of the TSV landing pad 150 have different widths in a direction parallel to a main surface extension direction (for example, an X direction) of the substrate 110, and a width of the first pad layer 152 is greater than a width of the second pad layer 154. However, it will be understood that the inventive concept is not limited thereto. In some embodiments, the first pad layer 152 and the second pad layer 154 of the TSV landing pad 150 have substantially the same width in the direction parallel to the main surface extension direction (for example, the X direction) of the substrate 110, which will be discussed below with reference to FIG. 5B. Alternatively, a width of the first pad layer 152 may be less than a width of the second pad layer 154.

In the TSV region, a second multi-layer wiring structure 170 is formed on the TSV landing pad 150. The second multi-layer wiring structure 170 includes a plurality of second wiring layers 172 that are formed at different levels to be spaced apart from one another, and a plurality of second contact plugs 174 that are disposed between the plurality of second wiring layers 172 and connect the plurality of second wiring layers 172. The second multi-layer wiring structure 170 further includes a plurality of second contact plugs 176 that are connected between any one second wiring layer 172 from among the plurality of second wiring layers 172, for example, a second wiring layer TM1 that is formed at a lowest level from among the plurality of second wiring layers 172, and the TSV landing pad 150, and are spaced apart from one another.

Each of the plurality of first wiring layers 142 and the plurality of first contact plugs 144 constituting the first multi-layer wiring structures 140, the plurality of second wiring layers 172 and the plurality of second contact plugs 174 constituting the second multi-layer wiring structure 170, and the first pad layer 152 and the second pad layer 154 constituting the TSV landing pad 150 may be formed of copper (Cu), tungsten (W), WN, tantalum (Ta), titanium (Ti), TaN, TiN, cobalt (Co), manganese (Mn), aluminum (Al), AlN, or a combination thereof.

In the TSV region, a TSV structure 180 passes through the substrate 110, the interlayer insulating film 124, and the etch-stop layer 126, and is connected to the TSV landing pad 150.

The TSV structure 180 may correspond to the TSV structure 30 of FIG. 1. The TSV structure 180 may include a conductive plug 182, and a conductive barrier film 184 that surrounds the conductive plug 182. In some embodiments, the conductive plug 182 includes Cu or W. For example, the conductive plug 182 may be formed of, but is not limited to, Cu, CuSn, CuMg, CuNi, CuZn, CuPd, CuAu, CuRe, CuW, W, or a W alloy. The conductive barrier film 184 may be a single-layer film or a multi-layer film including at least one material selected from the group of W, WN, WC, Ti, TiN, Ta, TaN, ruthenium (Ru), Co, Mn, WN, nickel (Ni), and NiB.

The TSV structure 180 is surrounded by a via insulating film 186 that passes through the substrate 110, the interlayer insulating film 124, and the etch-stop layer 126. The TSV structure 180 may be spaced apart from the substrate 110, the interlayer insulating film 124, and the etch-stop layer 126 due to the via insulating film 186.

The via insulating film 186 may be an oxide film, a nitride film, a carbide film, a polymer film, or a combination thereof. The via insulating film 186 may have a cylindrical shape that surrounds the TSV structure 180. In some embodiments, the via insulating film 186 is formed to have a thickness ranging from, but is not limited to, about 500 Å to about 2500 Å.

The TSV structure 180 and the via insulating film 186 are formed in a via hole H that passes through the substrate 110, the interlayer insulating film 124, and the etch-stop layer 126.

Figure 2B:
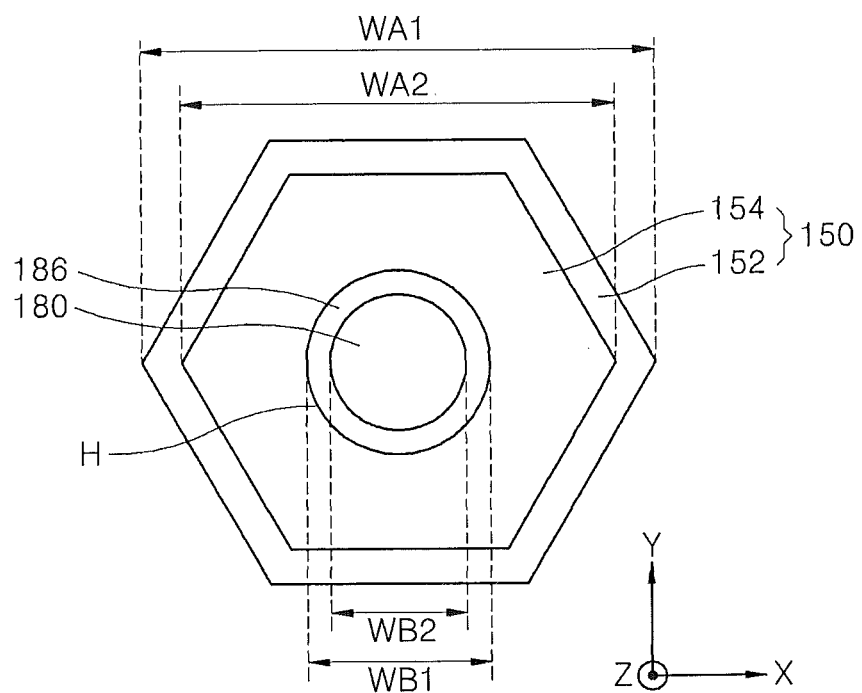
FIG. 2B is a plan view illustrating a through-silicon via (TSV) landing pad of the IC device of FIG. 2A.

Referring now to FIG. 2B, a plan view illustrating the TSV landing pad 150, the TSV structure 180, and the via insulating film 186 of FIG. 2A will be discussed. As illustrated in FIG. 2B, in the direction (for example, the X direction of FIGS. 2A and 2B) parallel to the main surface extension direction of the substrate 110, a width WB1 of the via hole H is less than a width WA1 of the TSV landing pad 150. The via hole H is formed to have the width WB1 that is less than a width WA2 of the second pad layer 154 within an area where the second pad layer 154 of the TSV landing pad 150 is formed.

The TSV landing pad 150 may be formed to have the width WB1 that is less than the width WA1 of the TSV landing pad 150 in a second area that is included in a first area where the TSV landing pad 150 is formed. Accordingly, the TSV structure 180 formed in the via hole H may be formed to have a width WB2 that is less than the width WB1 of the via hole H and the width WA1 of the TSV landing pad 150 and to be connected to the TSV landing pad 150 in a third area that is included in the first area and the second area.

In the direction (for example, the X direction of FIGS. 2A and 2B) parallel to the main surface extension direction of the substrate 110, the width WA1 of the first pad layer 152 and the width WA2 of the second pad layer 154 are different from each other. Although the width WA1 of the first pad layer 152 is greater than the width WA2 of the second pad layer 154 in FIG. 2B, the inventive concept is not limited thereto.

Referring back to FIG. 2A, in the direction (for example, the X direction of FIGS. 2A and 2B) parallel to the main surface extension direction of the substrate 110, the width WA2 of the second pad layer 154 is greater than a width WC1 of the first contact plug C1 that is formed at the same level as that of the second pad layer 154 in the MC region.

A recessed surface 150R that communicates with the via hole H may be formed on a bottom surface of the TSV landing pad 150. In some embodiments, the recessed surface 150R is formed due to overetching when the via hole H is formed in a resultant structure including the TSV landing pad 150. Alternatively, the recessed surface 150R may not be formed on the TSV landing pad 150.

The TSV structure 180 has a top surface 180T that contacts the TSV landing pad 150. In some embodiments, all portions of the top surface 180T of the TSV structure 180 contact the TSV landing pad 150. Alternatively, only a portion of the top surface 180T of the TSV structure 180 may contact the TSV landing pad 150. In these embodiments, a portion of the top surface 180T of the TSV structure 180 which does not contact the TSV landing pad 150 may contact a part of the intermetal insulating film 132, which will be explained below in detail with reference to FIGS. 4A through 4D.

Figure 2C:
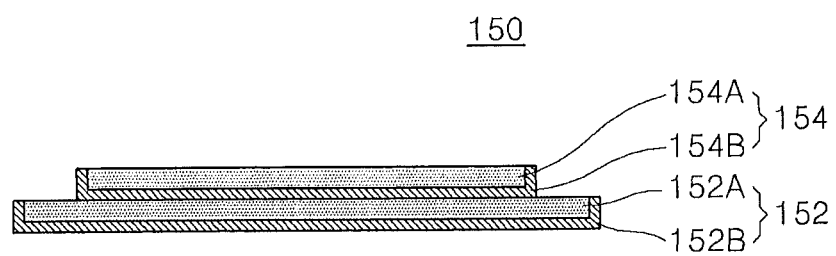
FIG. 2C is an enlarged cross-section of the TSV landing pad of the IC device of FIG. 2A.

Referring to FIG. 2C, an enlarged cross-section for explaining the TSV landing pad 150 of FIG. 2A will be discussed. As illustrated FIG. 2C, the first pad layer 152 includes a first metal layer 152A, and a first conductive barrier film 152B that surrounds a bottom surface and a side wall of the first metal layer 152A. The second pad layer 154 includes a second metal layer 154A, and a second conductive barrier film 154B that surrounds a bottom surface and a side wall of the second metal layer 154A.

In some embodiments, each of the first metal layer 152A and the second metal layer 154A is formed of Cu, W, Ta, Ti, Co, Mn, Al, or a combination thereof. In some embodiments, each of the first conductive barrier film 152B and the second conductive barrier film 154B is formed of a metal or a conductive metal nitride, for example, Ta, Ti, TaN, TiN, AlN, WN, or a combination thereof.

Each of the plurality of first wiring layers 142 constituting the first multi-layer wiring structures 140 and the plurality of second wiring layers 172 constituting the second multi-layer wiring structure 170 of FIG. 2A may include a metal layer that is formed of the same material as that of the first metal layer 152A, and a conductive barrier film that surrounds a bottom surface and a side wall of the metal layer and is formed of the same material as that of the first conductive barrier film 152B, like the first pad layer 152 described with reference to FIG. 2C.

Each of the plurality of first contact plugs 144 constituting the first multi-layer wiring structures 140 and the plurality of second contact plugs 174 constituting the second multi-layer wiring structure 170 may include a metal layer that is formed of the same material as that of the second metal layer 154A, and a conductive barrier film that surrounds a bottom surface and a side wall of the metal layer and is formed of the same material as that of the second conductive barrier film 154B, like the second pad layer 154 described with reference to FIG. 2C.

Referring back to FIG. 2A, a contact pad 179 is formed on the intermetal insulating film 132, and a passivation layer 183 and a plurality of bumps 185 are formed on the BEOL structure 130. Although one contact pad 179 is illustrated in FIG. 2A, a plurality of contact pads similar to the contact pad 179 may be further formed on the BEOL structure 130.

Although each of the bumps 185 has a stacked structure in which a first metal layer 185A and a second metal layer 185B are stacked, the inventive concept is not limited thereto, and the bump 185 may have any of various other structures.

Figure 3A:
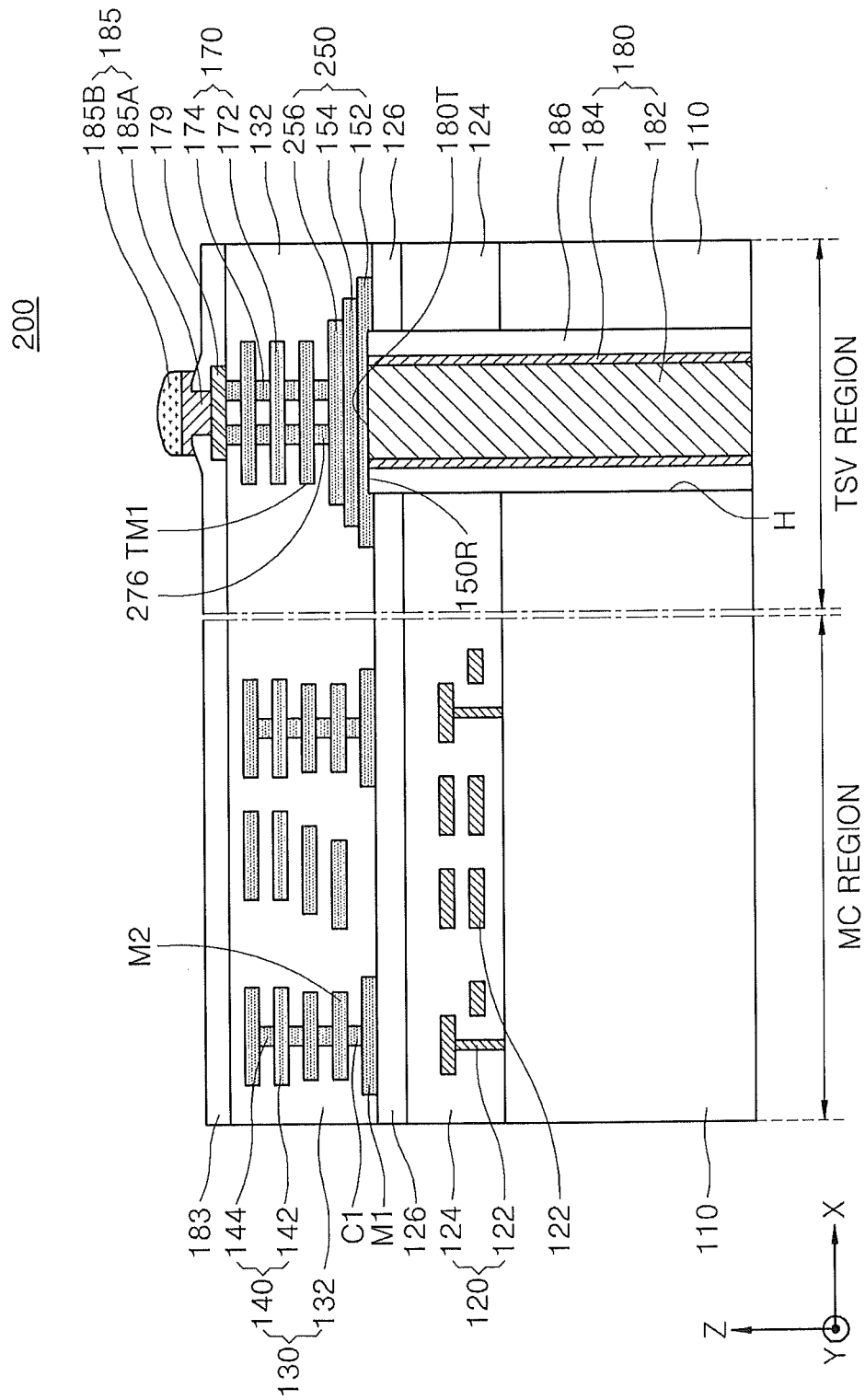
FIG. 3A is a cross-section of the IC device according to some embodiments of the inventive concept.

Referring to FIG. 3A, a cross-section for explaining an IC device 200 according to some embodiments of the inventive concept will be discussed. In FIG. 3A, the same elements as those in FIG. 2A are denoted by the same reference numerals and, therefore, details thereof will not be repeated in the interest of brevity.

Referring to FIG. 3A, in the IC device 200, a TSV landing pad 250 is substantially the same as the TSV landing pad 150 of FIG. 2A. However, the TSV landing pad 250 further includes a third pad layer 256 that is connected to the second pad layer 154 to vertically overlap with the first pad layer 152 and is formed at the same level as that of a first wiring layer M2 from among the plurality of first wiring layers 142.

Figure 3B:
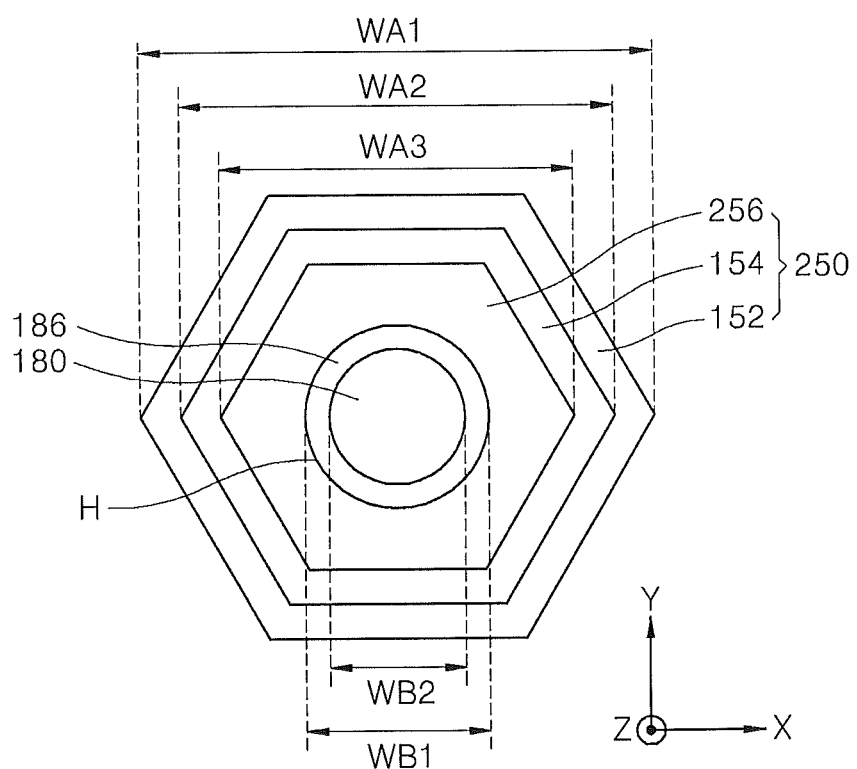
FIG. 3B is a plan view illustrating a TSV landing pad of the IC device of FIG. 3A.

Referring to FIG. 3B, a plan view illustrating the TSV landing pad 250, the TSV structure 180, and the via insulating film 186 of FIG. 3A will be discussed. In FIG. 3B, the same elements as those in FIG. 2B are denoted by the same reference numerals and, therefore, details thereof will not be repeated herein in the interest of brevity.

Referring to FIG. 3B, in the direction (for example, the X direction of FIGS. 3A and 3B) parallel to the main surface extension direction of the substrate 110, a width WA3 of the third pad layer 256 of the TSV landing pad 250 is less than the width WA2 of the second pad layer 154.

The via hole H is formed to have the width WB1 that is less than the width WA3 of the third pad layer 256 within an area where the third pad layer 256 of the TSV landing pad 250 is formed.

The third pad layer 256 may include a metal layer that is formed of the same material as that of the first metal layer 152A, and a conductive barrier film that surrounds a bottom surface and a side wall of the metal layer and is formed of the same material as that of the first conductive barrier film 152B, like the first pad layer 152 discussed above with reference to FIG. 2C.

In the direction (for example, the X direction of FIGS. 3A and 3B) parallel to the main surface extension direction of the substrate 110, the width WA1 of the first pad layer 152, the width WA2 of the second pad layer 154, and the width WA3 of the third pad layer 256 are different from one another. In FIG. 3B, widths of the first, second, and third pad layers 152, 154, and 256 constituting the TSV landing pad 250 decrease farther away from the substrate 110. However, according to the present embodiment, the first, second and third pad layers 152, 154, and 256 may have various widths. For example, widths of the first, second, and third pad layers 152, 154, and 256 may increase farther away from the substrate 110. Alternatively, widths of the first, second, and third pad layers 152, 154, and 256 may be the same, or may be irregularly different from one another. The TSV landing pad 250 is connected to the second multi-layer wiring structure 170 through a plurality of second contact plugs 276.

Figure 4A:
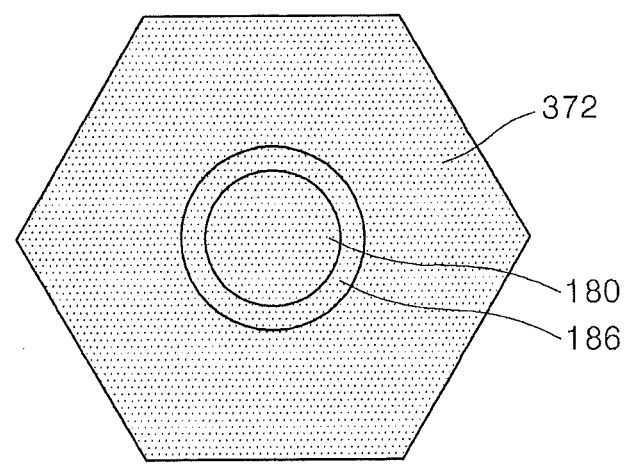
FIGS. 4A through 4D are plan views illustrating landing pad layers that may be used as a TSV landing pad of an IC device according to some embodiments of the inventive concept.
Figure 4B:
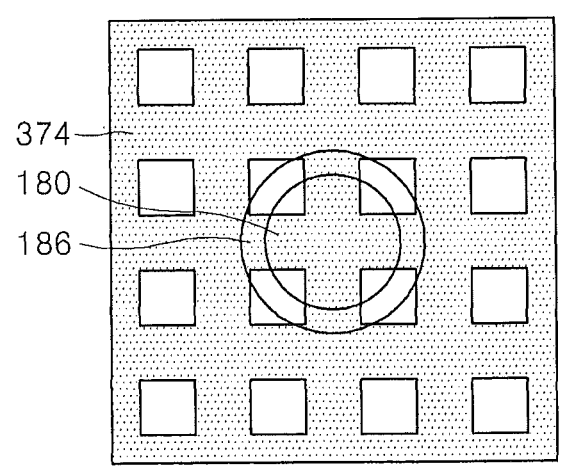

FIGS. 4A through 4B illustrate plan views illustrating landing pad layers 372, 374, 376, and 378 that may be used instead of at least one pad layer from among the first pad layer 152, the second pad layer 154, and the third pad layer 256 constituting the TSV landing pad 150 of FIG. 2A or the TSV landing pad 250 of FIG. 3A, In FIGS. 4A through 4D, both the TSV structure 180 and the via insulating film 186 (see FIGS. 2A and 3A) are illustrated.

As illustrated in FIGS. 4A through 4D, a landing pad layer having any of various planar structures may be used as at least one pad layer from among the first pad layer 152, the second pad layer 154, and the third pad layer 256 of FIGS. 2A and 3A.

In particular, at least one of the first pad layer 152, the second pad layer 154, and the third pad layer 256 of FIGS. 2A and 3A may have the same structure as that of the landing pad layer 372 including a continuous conductive layer that continuously extends as shown in FIG. 4A.

When the first pad layer 152 of FIGS. 2A and 3A has the same structure as that of the landing pad layer 372 of FIG. 4A, all portions of the top surface 180T of the TSV structure 180 may contact the TSV landing pad 150 or the TSV landing pad 250.

Although the landing pad layer 372 has a hexagonal planar shape in FIG. 4A, it will be understood that embodiments of the inventive concept are not limited thereto. For example, the landing pad layer 372 may have any of various shapes such as a circular shape, an oval shape, a triangular shape, or a quadrangular shape without departing from the scope of the present inventive concept.

Alternatively, at least one of the first pad layer 152, the second pad layer 154, and the third pad layer 256 of FIGS. 2A and 3A may have the same structure as that of the landing pad layer 374 having a mesh-like planar shape as shown in FIG. 4B.

Although the landing pad layer 374 has a quadrangular planar shape in FIG. 4B, it will be understood that embodiments of the inventive concept is not limited thereto. For example, the landing pad layer 374 may have any one shape selected from the group of a circular shape, an oval shape, and various polygonal shapes without departing from the scope of the inventive concept.

Figure 4C:
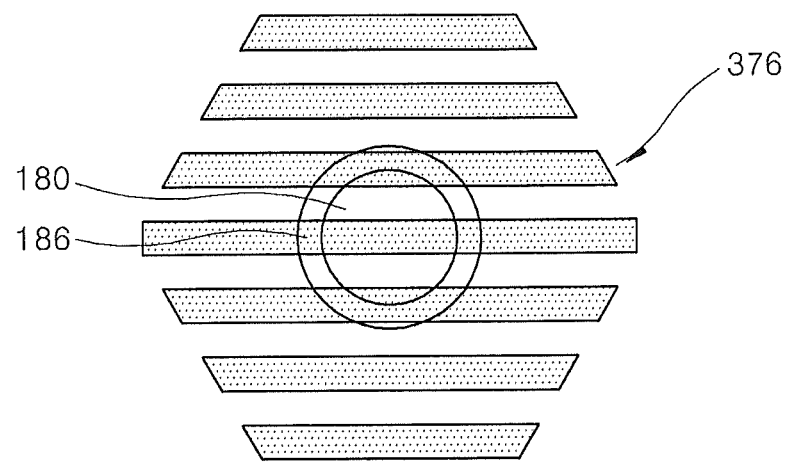

Alternatively, at least one of the first pad layer 152, the second pad layer 154, and the third pad layer 256 of FIGS. 2A and 3A may have the same structure as that of the landing pad layer 376 having a planar shape consisting of a plurality of line patterns that are spaced apart from one another as shown in FIG. 4C.

Figure 4D:
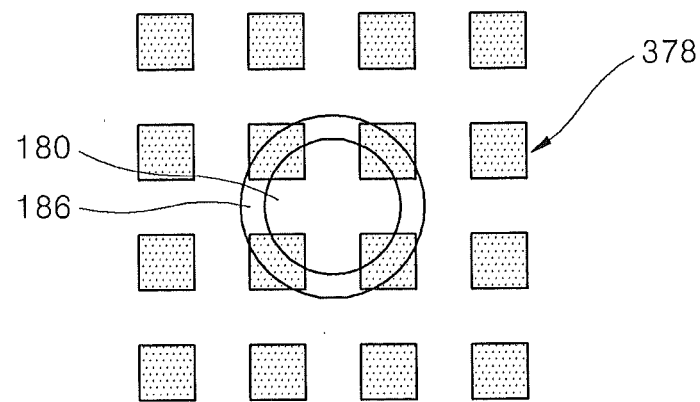

Alternatively, at least one of the first pad layer 152, the second pad layer 154, and the third pad layer 256 of FIGS. 2A and 3A may have the same structure as that of the landing pad layer 378 having a planar shape consisting of a plurality of islands that are spaced apart from one another as shown in FIG. 4D.

When the first pad layer 152 of FIGS. 2A and 3A has the same structure as that of any one landing pad layer from among the landing pad layers 374, 376, and 378 of FIGS. 4B through 4D, only a part of the top surface 180T (see FIGS. 2A and 3A) of the TSV structure 180 may contact the landing pad layers 374, 376, and 378. In these embodiments, a portion of the top surface 180T of the TSV structure 180 which does not contact the landing pad layers 374, 376, and 378 may contact a part of the intermetal insulating film 132 (see FIGS. 2A and 3A).

When the TSV landing pad 150 having a double-layer structure as shown in FIG. 2A is used, the first pad layer 152 and the second pad layer 154 of the TSV landing pad 150 may have different structures selected from those of the landing pad layers 372, 374, 376, and 378 of FIGS. 4A through 4D. Alternatively, when the TSV landing pad 250 having a three-layer structure as shown in FIG. 3A is used, at least some of the first pad layer 152, the second pad layer 154, and the third pad layer 256 of the TSV landing pad 250 may have different structures selected from those of the landing pad layers 372, 374, 376, and 378 of FIGS. 4A through 4D.

When any one structure from among those of the landing pad layers 374, 376, and 378 having a discontinuous planar shape including portions that are not continued as shown in FIGS. 4B through 4D is used for at least a part of the TSV landing pad 150 of FIG. 2A or the TSV landing pad 250 of FIG. 3A, the likelihood of a problem, which may occur when the TSV landing pad 150 or the TSV landing pad 250 comes off from a lower structure or is separated from the TSV structure 180 that is disposed under the TSV landing pad 150 or the TSV landing pad 250 due to physical stress applied to the TSV landing pad 150 or the TSV landing pad 250, thus leading to poor contact, may be reduced, or possibly prevented.

Figure 5A:
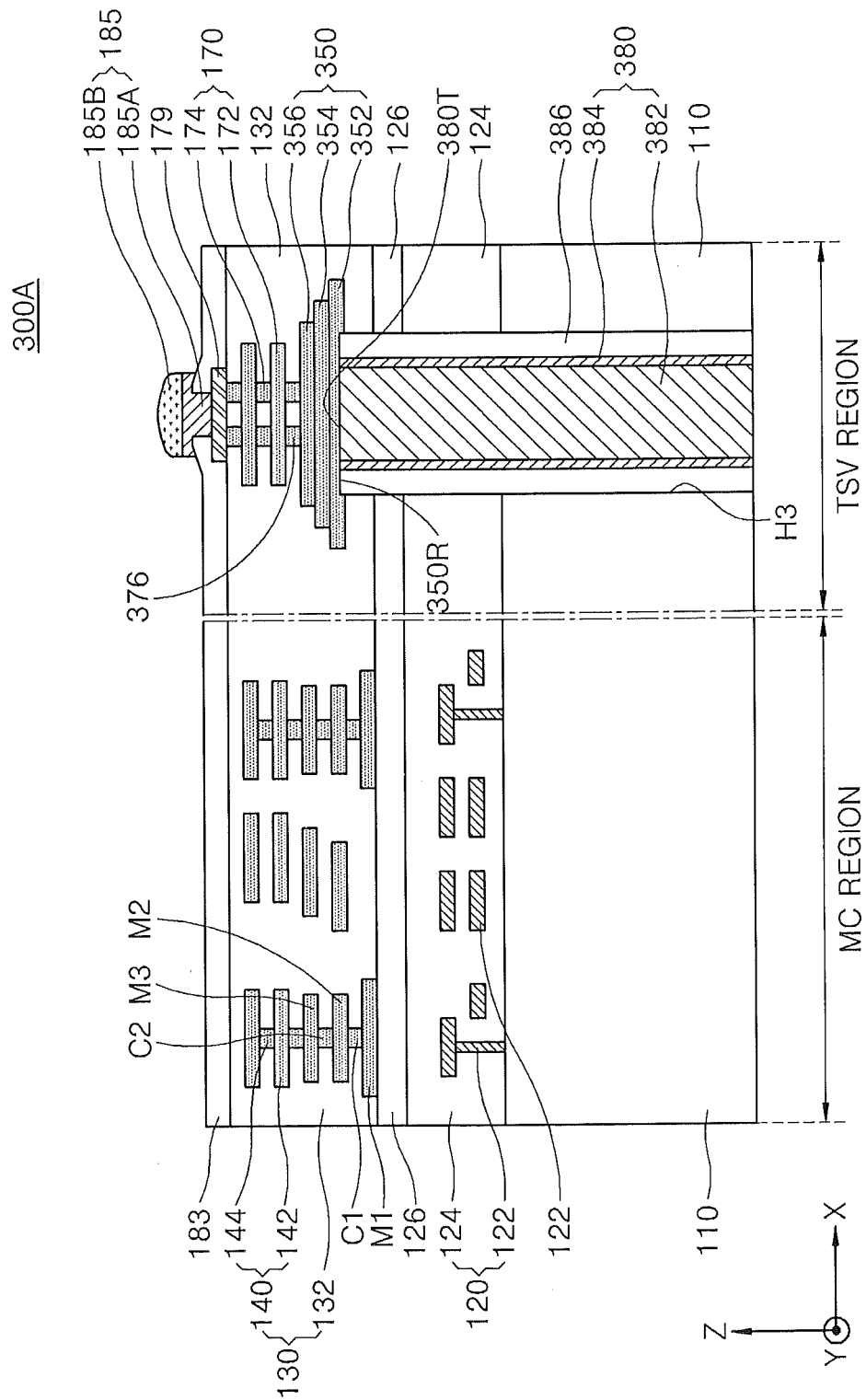
FIG. 5A is a cross-section of the IC device according to some embodiments of the inventive concept.

Referring to FIG. 5A, a cross-section for explaining an IC device 300A according to some embodiments of the inventive concept will be discussed. As illustrated in FIG. 5A, the same elements as those in FIGS. 2A and 3A are denoted by the same reference numerals and, therefore, details with respect to these embodiments will not be repeated herein.

Referring to FIG. 5A, a TSV landing pad 350 of the IC device 300A is substantially the same as the TSV landing pad 250 of FIG. 3A. However, the TSV landing pad 350 has a three-layer structure including a first pad layer 352, a second pad layer 354, and a third pad layer 326. The first pad layer 352 is formed at the same level as that of the first wiring layer M2 that is farther from the substrate 110 than the first wiring layer M1 that is formed at the lowest level from among the plurality of first wiring layers 142 that are formed in the MC region. The second pad layer 354 is formed at the same level as that of a first contact plug C2 that is directly formed on the first wiring layer M2. The third pad layer 356 is formed at the same level as that of a first wiring layer M3 that is directly formed on the first contact plug C2 from among the plurality of first wiring layers 142.

The TSV landing pad 350 is connected to the second multilayer wiring structure 170 through a plurality of second contact plugs 376.

The description of the first, second, and third pad layers 152, 154, and 256 of the TSV landing pad 250 made with reference to FIGS. 3A and 3B applies to the first, second, and third pad layers 352, 354, and 356, respectively, of the TSV landing pad 350.

In the TSV region, a TSV structure 380 is connected to the TSV landing pad 350 in a via hole H3 that passes through a part of the substrate 110, the interlayer insulating film 124, the etch-stop layer 126, and the intermetal insulating film 132. The TSV structure 380 may include a conductive plug 382, and a conductive barrier film 384 that surrounds the conductive plug 382. The TSV structure 380 is surrounded by a via insulating film 386.

A recessed surface 350R that communicates with the via hole H3 is formed on a bottom surface of the TSV landing pad 350. The recessed surface 350R may be formed due to over-etching when the via hole H3 is formed in a resultant structure including the TSV landing pad 150. Alternatively, the recessed surface 350R may not be formed on the TSV landing pad 350. The TSV structure 380 has a top surface 380T that contacts the TSV landing pad 350. At least a part of the top surface 380T of the TSV structure 380 may contact the TSV landing pad 350.

The description of the TSV structure 150 and the via insulating film 186 made with reference to FIG. 2A applies to the TSV structure 380 and the via insulating film 386.

Figure 5B:
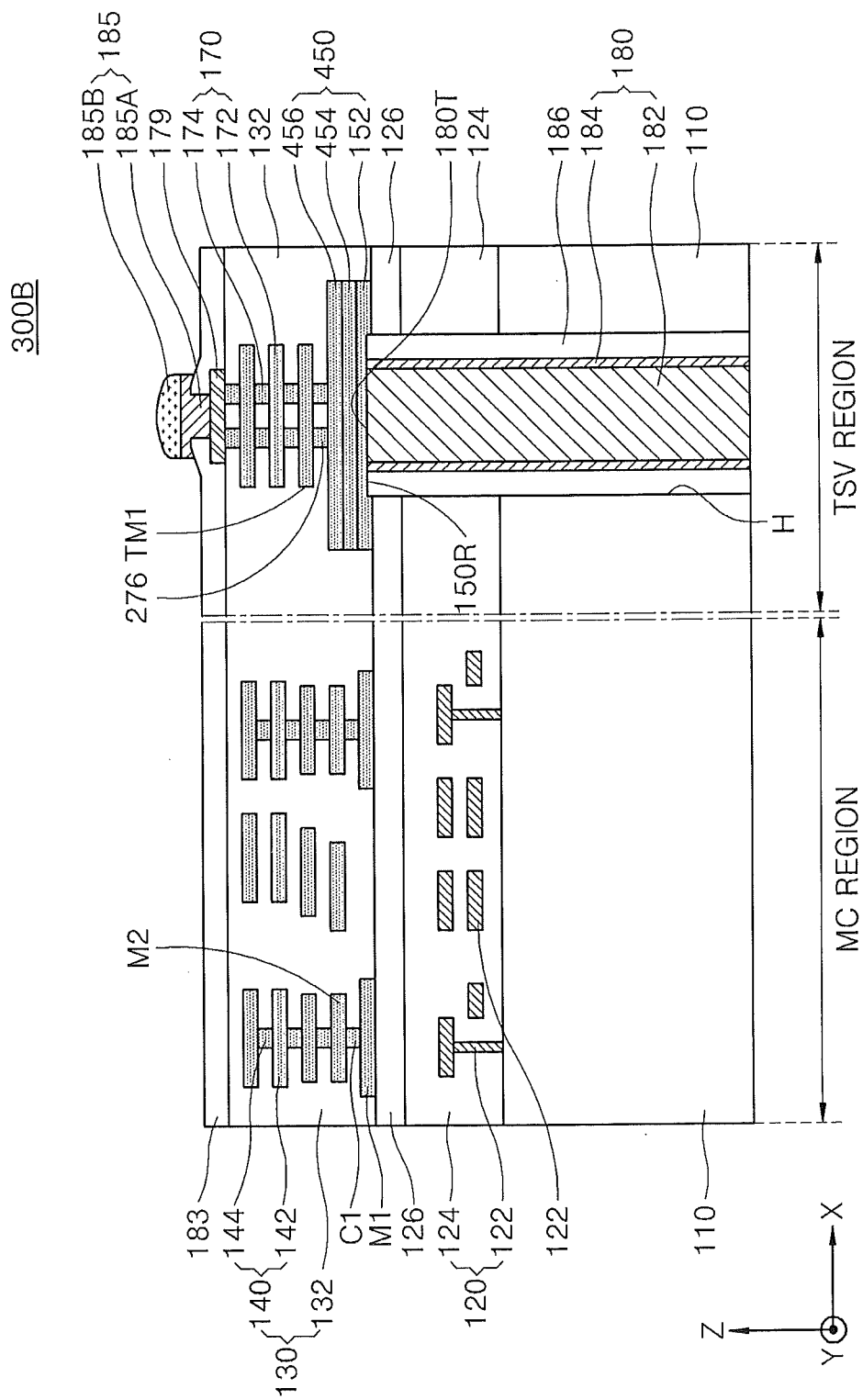
FIG. 5B is a cross-section of the IC device according to some embodiments of the inventive concept.

Referring to FIG. 5B, a cross-section of an IC device 300B according to some embodiments of the inventive concept will be discussed. As illustrated in FIG. 5B, the same elements as those in FIGS. 2A and 3A are denoted by the same reference numerals and, therefore, details thereof will not be repeated herein in the interest of brevity.

Referring to FIG. 5B, in the IC device 300B, a TSV landing pad 450 is substantially the same as the TSV landing pad 250 of FIG. 3A. However, the TSV landing pad 450 has a three-layer structure including the first pad layer 152, a second pad layer 454, and a third pad layer 456. The second pad layer 454 and the third pad layer 456 have substantially the same width as that of the first pad layer 152 in the direction (for example, the X direction of FIG. 5B) parallel to the main surface extension direction of the substrate 110.

The description of the second pad layer 154 and the third pad layer 256 made with reference to FIG. 3A also applies to the second pad layer 454 and the third pad layer 456, and thus a detailed explanation of the second pad layer 454 and the third pad layer 456 will not be given.

Figure 6A:
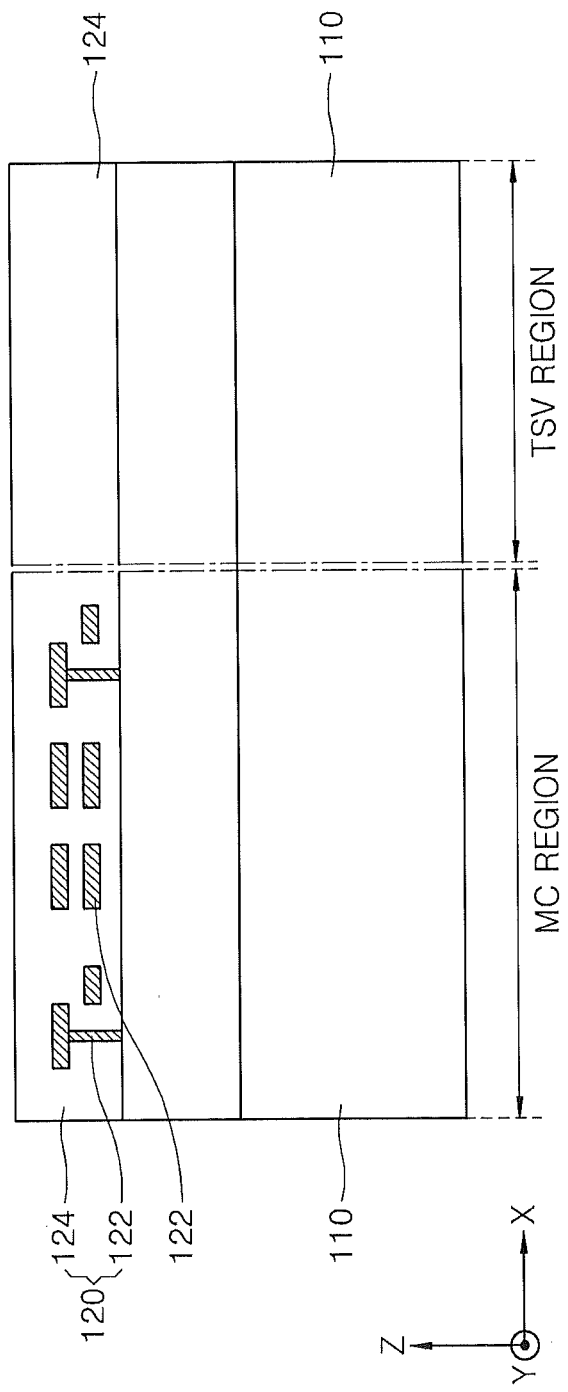
Figure 6C:
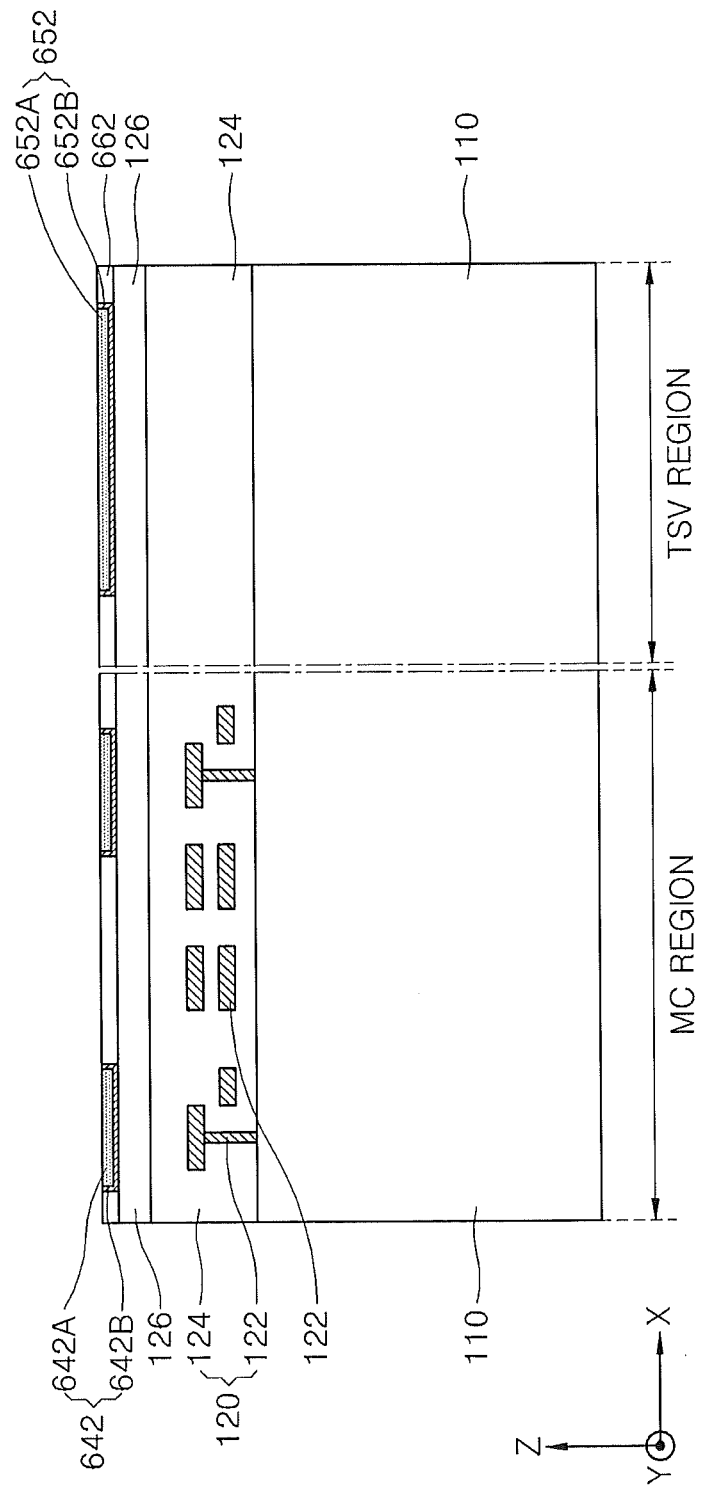
Figure 6E:
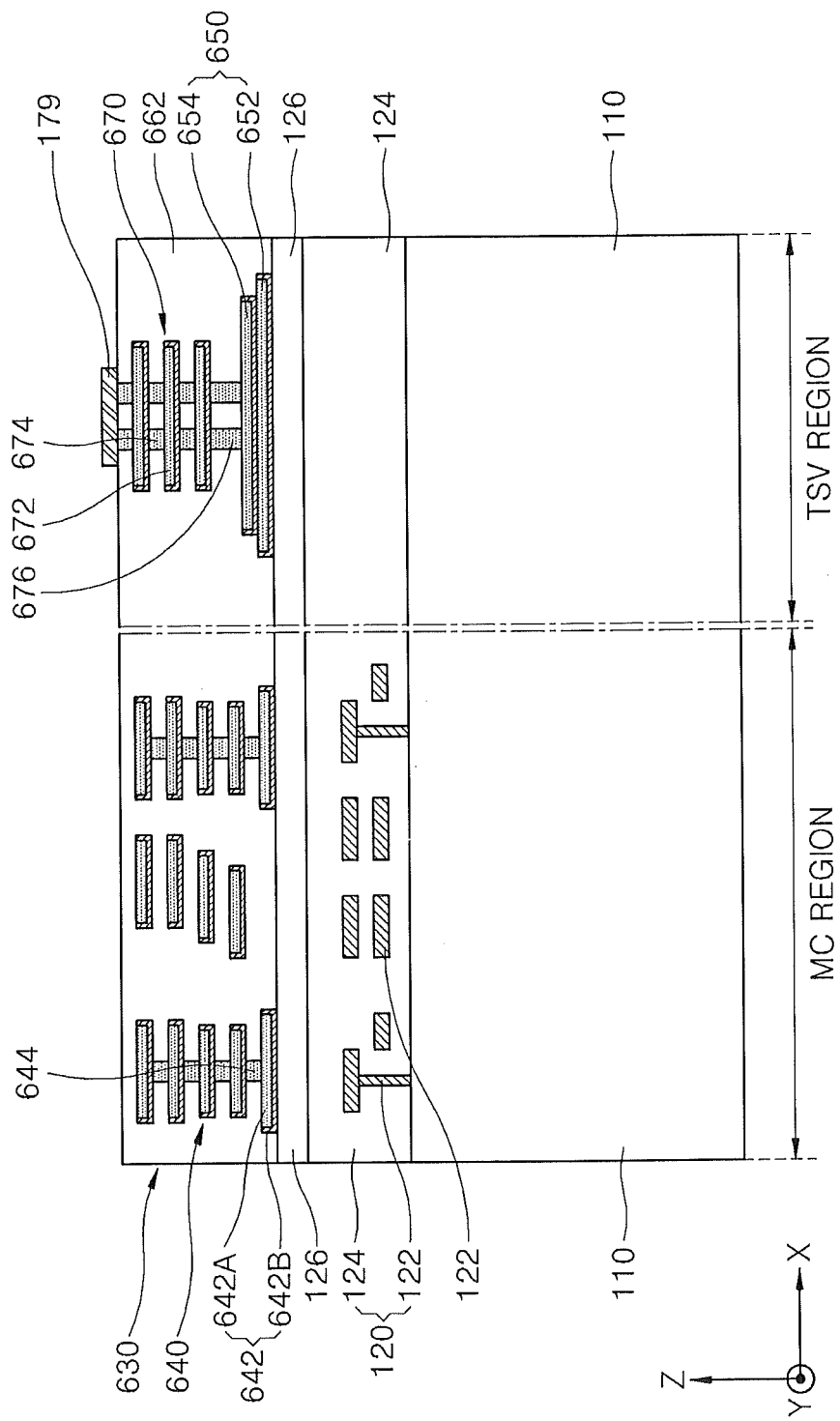
Figure 6F:
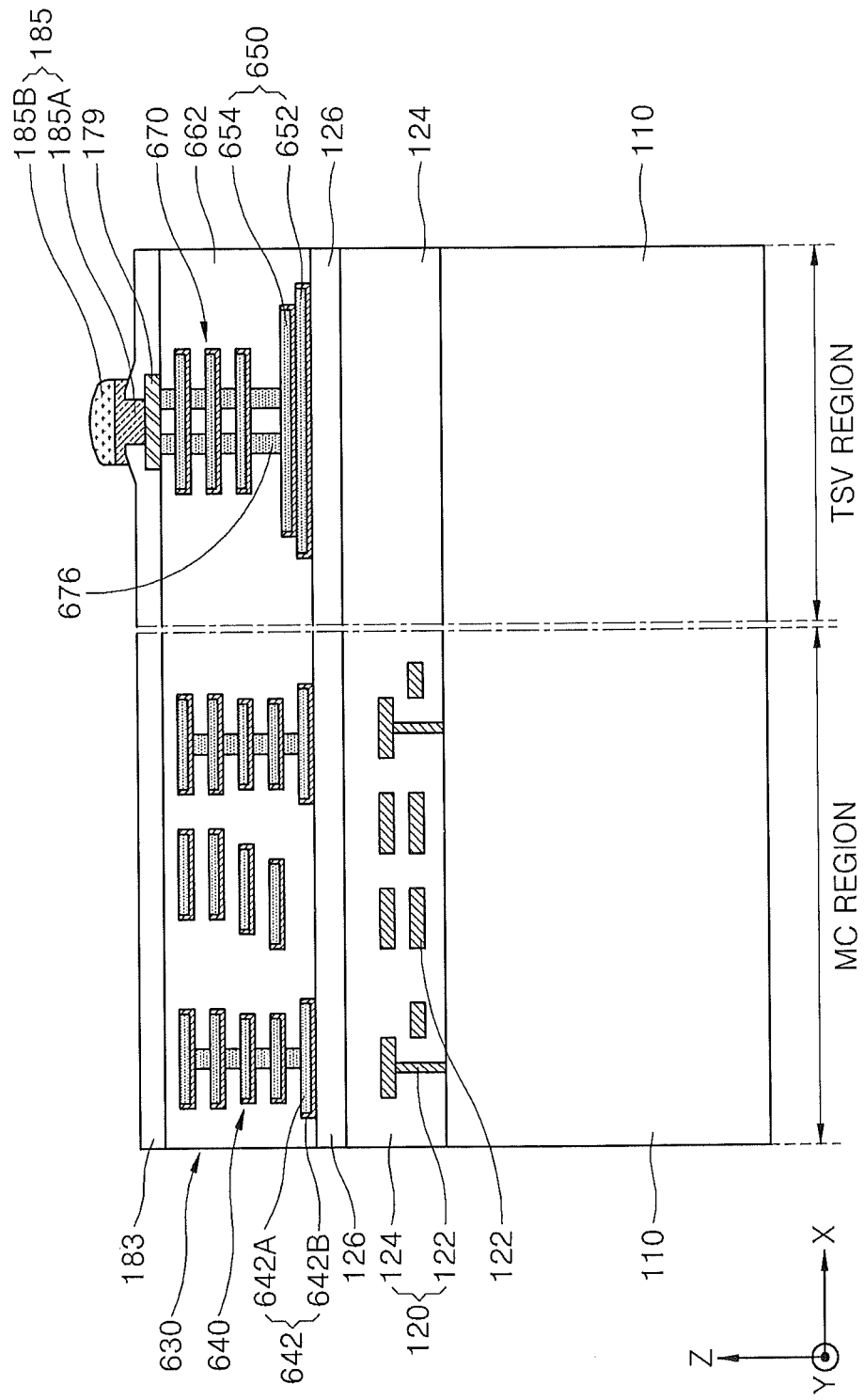
Figure 6G:
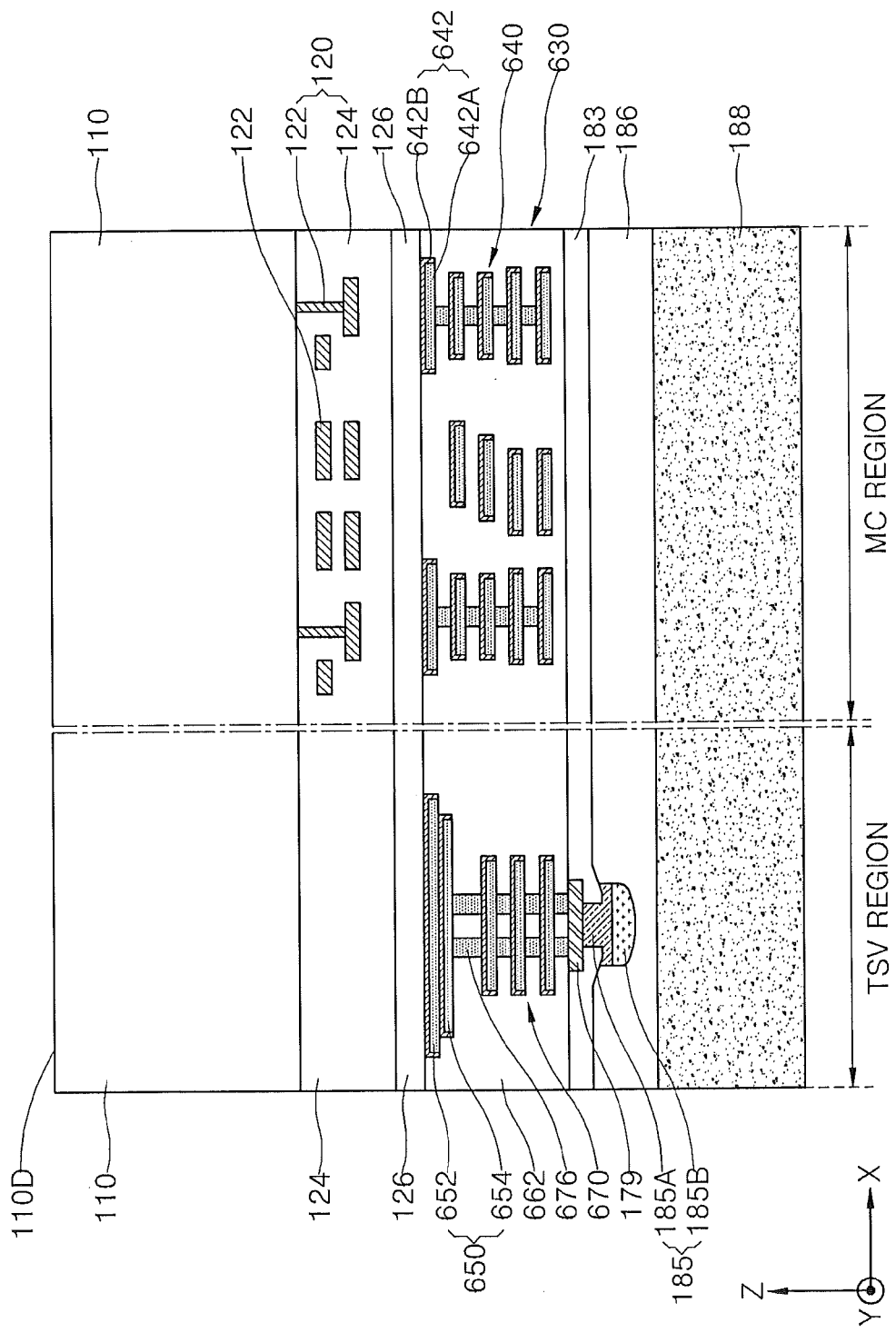
Figure 6H:
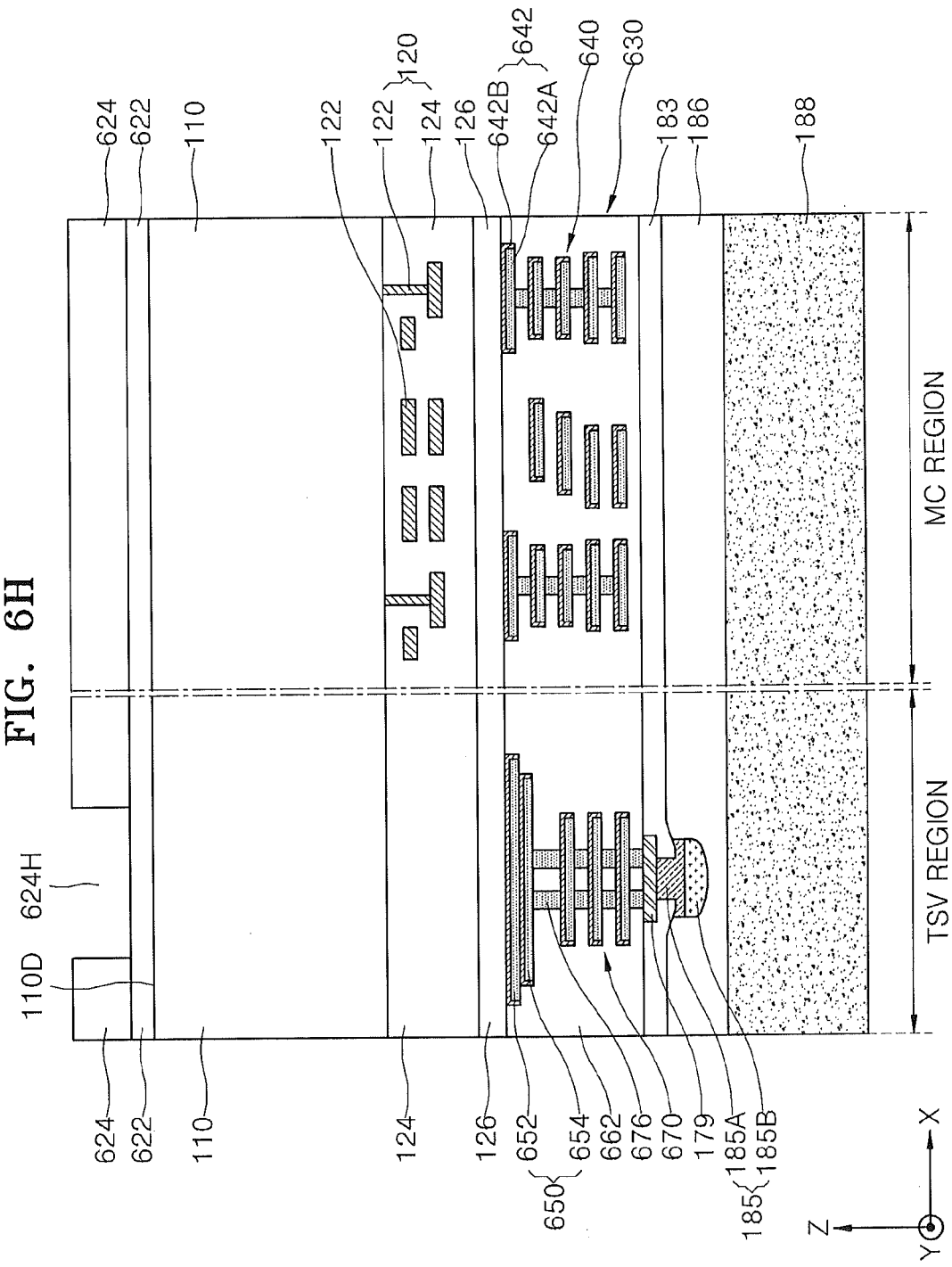
Figure 6I:
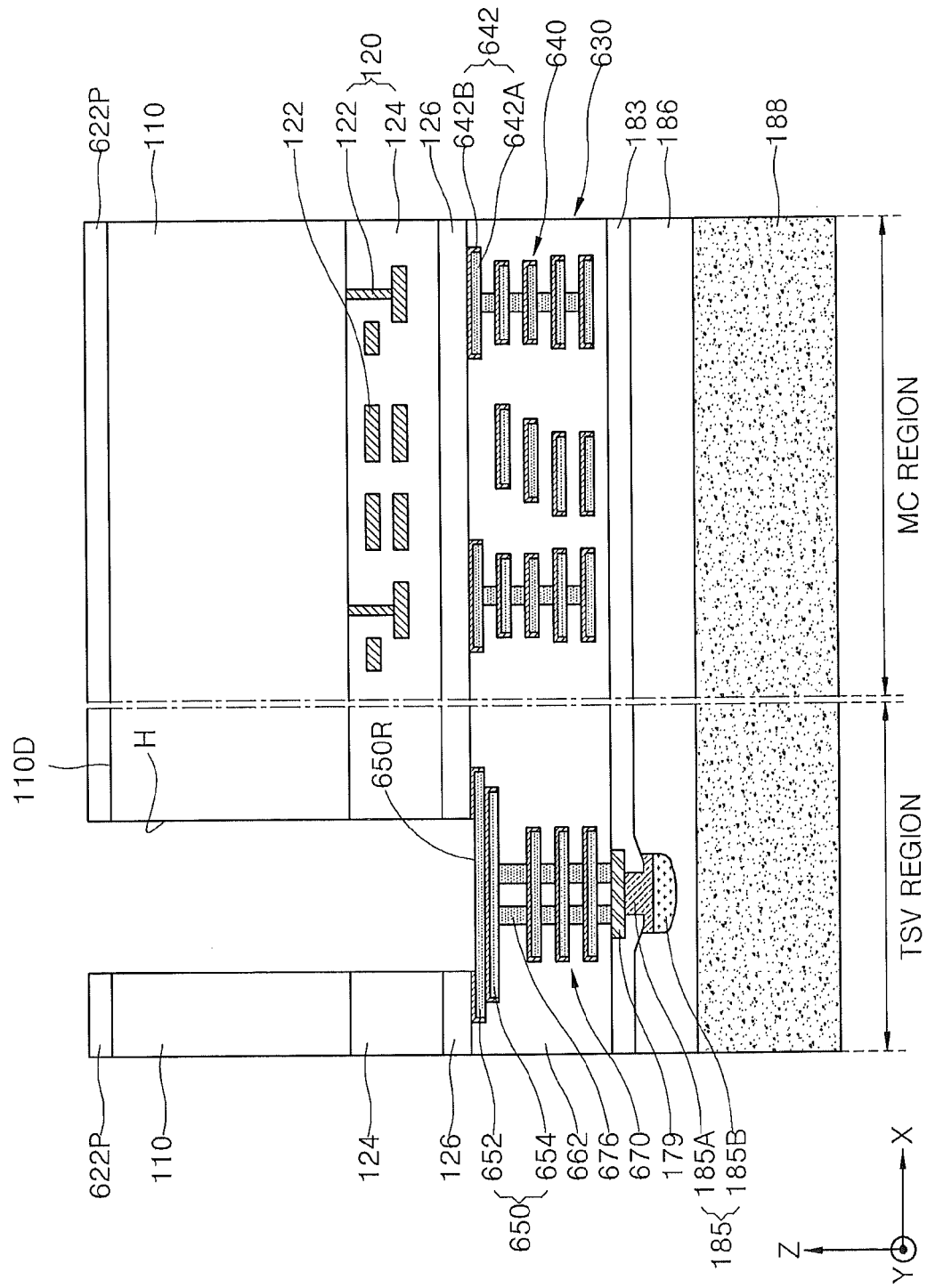
Figure 6J:
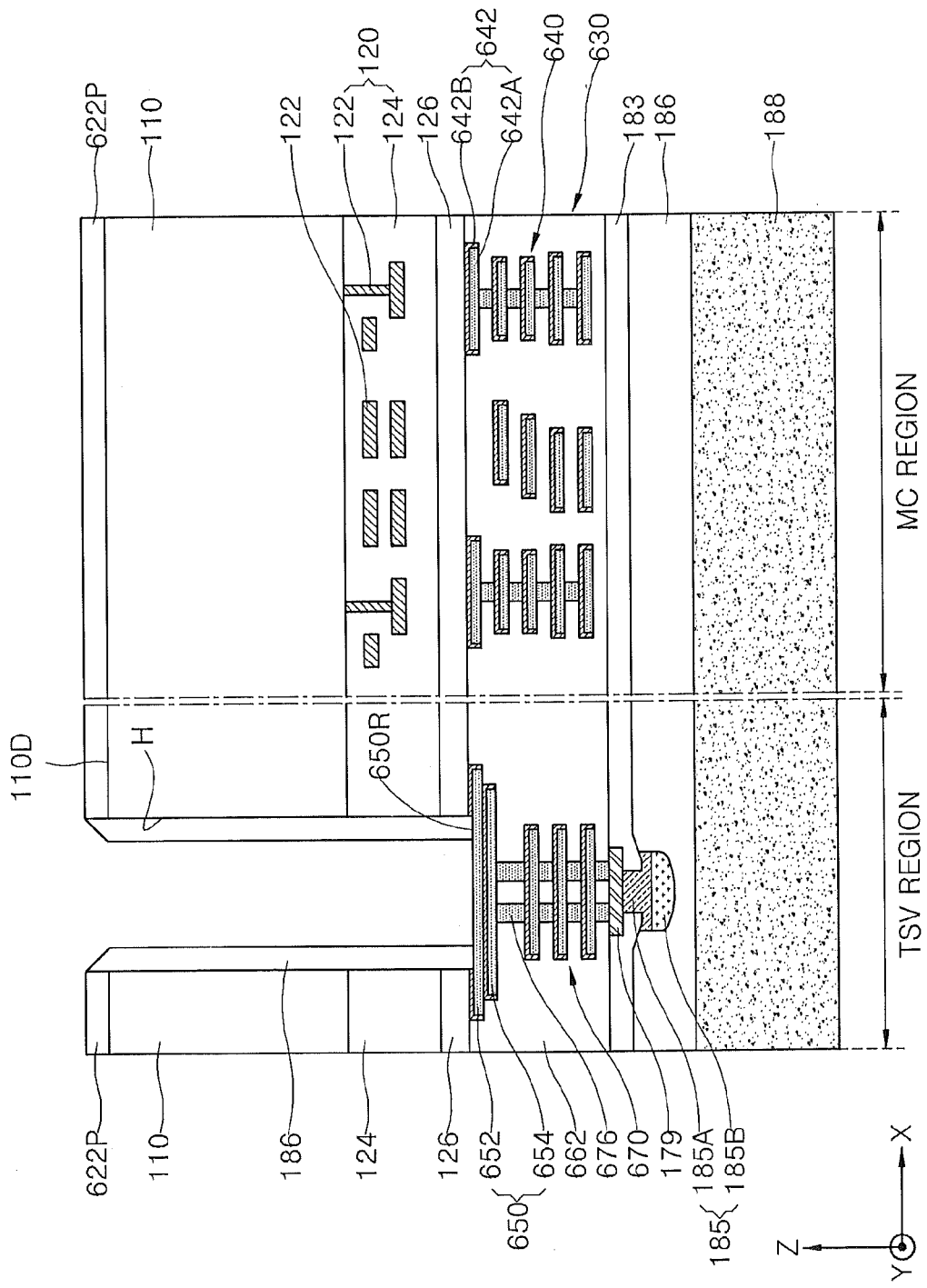
Figure 6L:
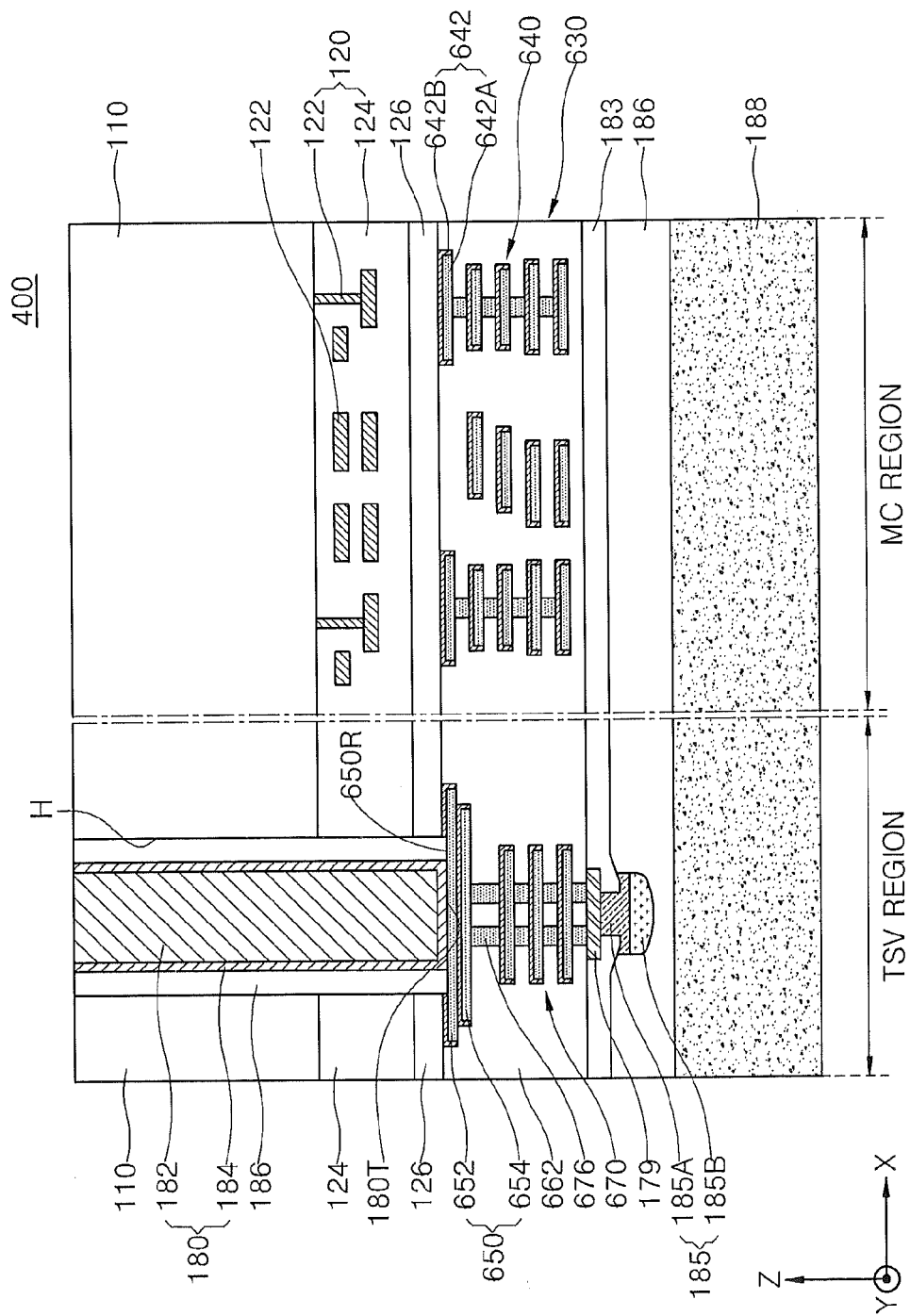

FIGS. 6A through 6L are cross-sections illustrating processing steps in the fabrication of IC devices 400 (see FIG. 6L) according to some embodiments of the inventive concept. The IC device 400 of FIG. 6L is similar to the IC device 100 of FIG. 2A. In FIGS. 6A through 6L, the same elements as those in FIG. 2A are denoted by the same reference numerals, and a detailed explanation thereof will not be given in order to avoid a repeated explanation.

Referring to FIG. 6A, the FEOL structure 120 is formed on the substrate 110 having the MC region and the TSV region. The FEOL structure 120 includes the plurality of individual devices 122 that are of various types, and the interlayer insulating film 124.

Referring to FIG. 6B, in the MC region and the TSV region, the etch-stop layer 126 is formed on the interlayer insulating film 124. An intermetal insulating film 662 and a polish-stop layer 664 are sequentially formed on the etch-stop layer 126, and are patterned to form a plurality of metal wiring holes 162H1 and 162H2 in the MC region and the TSV region.

The metal wiring holes 162H1 that are formed in the MC region from among the metal wiring holes 162H1 and 162H2 are for forming a plurality of first multi-layer wiring structures in the MC region, and the metal wiring hole 162H2 that is formed in the TSV region is for forming a TSV landing pad in the TSV region.

The etch-stop layer 126 may be used as an etch stopper when the polish-stop layer 664 and the intermetal insulating film 662 are etched in order to form the metal wiring holes 162H1 and 162H2. Alternatively, the etch-stop layer 126 may be omitted. When the etch-stop layer 126 is omitted, the intermetal insulating film 662 may be directly formed on the interlayer insulating film 124.

Although the intermetal insulating film 662 may be formed of tetra-ethyl-ortho-silicate (TEOS) and the polish-stop layer 664 may be formed of a silicon oxynitride film, the inventive concept is not limited thereto. Thicknesses of the intermetal insulating film 662 and the polish-stop layer 664 may be arbitrarily determined as desired.

Referring to FIG. 6C, a first metal wiring layer 642 is formed in each of the metal wiring holes 162H in the MC region, and a first pad layer 652 is formed in the metal wiring hole 162H2 in the TSV region.

The first metal wiring layer 642 that is formed in the MC region includes a metal layer 642A, and a conductive barrier film 642B that surrounds a bottom surface and a side wall of the metal layer 642A.

The first pad layer 652 that is formed in the TSV region includes a metal layer 652A, and a conductive barrier film 652B that surrounds a bottom surface and a side wall of the metal layer 652A.

In order to form the first metal wiring layer 642 and the first pad layer 652, a first film for forming the conductive barrier films 642B and 652B and a second film for forming the metal layers 642A and 652A are sequentially formed in the plurality of metal wiring holes 162H1 and 162H2 and the polish-stop layer 664 (see FIG. 6B), and then a resultant structure including the first film and the second film is polished by using chemical mechanical polishing (CMP) by using the polish-stop layer 664 (see FIG. 6B) as a stopper. The polishing may be performed until the polish-stop layer 664 is removed and the intermetal insulating film 662 is exposed. As a result, the first metal wiring layer 642 remains in each of the metal wiring holes 162H1 in the MC region, and the first pad layer 652 remains in the metal wiring hole 162H2 in the TSV region.

Each of the metal layers 642A and 652A may be formed of Cu, W, Ta, Ti, Co, Mn, Al, or a combination thereof. Each of the conductive barrier films 642B and 652B may be formed of a metal or a conductive metal nitride, for example, Ta, Ti, TaN, TiN, AlN, WN, or a combination thereof.

Physical vapor deposition (PVD) may be used in order to form the conductive barrier films 642B and 652B. Each of the conductive barrier films 642B and 652B may be formed to have a thickness ranging from about 1000 Å to about 1500 Å.

Each of the metal layers 642A and 652A may be formed of a Cu film that is formed by using electroplating. In these embodiments, in order to form the metal layers 642A and 652A, a Cu seed layer may be formed on surfaces of the conductive barrier films 642B and 652B, a Cu layer may be grown from the Cu seed layer by using electroplating, and a resultant structure including the Cu layer may be annealed. Each of the first metal wiring layer 642 and the first pad layer 652 may be formed to have a thickness of at least 30 nm.

Referring to FIG. 6D, a first contact plug 644 is formed on the first metal wiring layer 642 in the MC region and a second pad layer 654 is formed on the first pad layer 652 in the TSV region by using a process similar to a process of forming the first metal wiring layer 642 and the first pad layer 652 described with reference to FIGS. 6B and 6C.

The first contact plug 644 formed in the MC region may correspond to the first contact plug C1 of FIG. 2A. The second pad layer 654 formed in the TSV region is formed at the same level as that of the first contact plug 644. The second pad layer 654 may correspond to the second pad layer 154 of FIG. 2A.

By alternately repeatedly performing a process of forming a plurality of contact plugs and a process of forming a plurality of metal wiring layers by using a method similar to that described with reference to FIGS. 6B and 6C, a plurality of first multi-layer wiring structures 640 each including a plurality of the first metal wiring layers 642 and a plurality of the first contact plugs 644 is formed in the MC region, and a TSV landing pad 650 including the first pad layer 652 and the second pad layer 654, and a second multi-layer wiring structure 670 that is connected to the TSV landing pad 650 are formed in the TSV region, thereby completing a BEOL structure 630.

In the TSV region, the second multi-layer wiring structure 670 includes a plurality of second metal wiring layers 672, and a plurality of second contact plugs 674 that are disposed between the plurality of second metal wiring layers 672 and connect the plurality of second metal wiring layers 672. The TSV landing pad 650 is connected to the second multi-layer wiring structure 670 through a plurality of second contact plugs 676.

The first pad layer 652 and the second pad layer 654 constituting the TSV landing pad 650 may correspond to the first pad layer 152 and the second pad layer 154 of FIG. 2A.

When the first multi-layer wiring structures 640 and the second multi-layer wiring structure 670 are formed, other multi-layer wiring patterns that include contact plugs and metal wiring layers that are formed at the same time as at least some selected from the plurality of first metal wiring layers 642 and the first contact plugs 644 may be formed in other portions of the substrate 110. As a result, the BEOL structure 630 including the intermetal insulating film 662 and the plurality of multi-layer wiring patterns that have portions insulated by the intermetal insulating film 662 may be obtained on the FEOL structure 120.

The intermetal insulating film 662 functions to space metal wiring layers constituting the second multi-layer wiring structure 670 apart from the plurality of first multi-layer wiring structures 640.

Although each of the plurality of first multi-layer wiring structures 640 includes the first metal wiring layers 642 having 5 layers and the first contact plugs 644 having 4 layers that have different distances from the substrate 110, and the second multi-layer wiring structure 670 includes the second metal wiring layers 672 having 3 layers and the second contact plugs 674 having 4 layers in FIG. 6D for simplicity of explanation, the inventive concept is not limited thereto. Also, a connection structure between the plurality of first multi-layer wiring structures 640 and the second multi-layer wiring structure 670 of FIG. 6D is exemplary, and the scope of the inventive concept is not limited to the connection structure of FIG. 6D.

Each of the plurality of first metal wiring layers 642 and the plurality of first contact plugs 644 constituting, the plurality of first multi-layer wiring structures 640 in the MC region, the first pad layer 652 and the second pad layer 654 constituting the TSV landing pad 650 in the TSV region, and the plurality of second metal wiring layers 672 and the plurality of second contact plugs 674 and 676 constituting the second multi-layer wiring structure 670 in the TSV region may include at least one metal selected from the group of W, Al, and Cu.

The BEOL structure 630 may be formed to include a plurality of wiring structures for connecting individual devices that are formed in the FEOL structure 120 to other wirings that are formed on the substrate 110. The BEOL structure 630 may be formed to further include a seal ring for protecting the wiring structures and other lower structures from external impact or moisture.

Referring to FIG. 6E, the contact pad 179 that is electrically connected to the second multi-layer wiring structure 670 is formed on the intermetal insulating film 662. The contact pad 179 may be formed of, for example, Al. A plurality of contact pads that are formed at the same level as that of the contact pad 179 may be formed on the intermetal insulating film 662.

Referring to FIG. 6F, the passivation layer 183 through which a part of the contact pad 179 is exposed is formed on the BEOL structure 630. The passivation layer 183 may be formed of, for example, polyimide or a silicon nitride film.

The plurality of bumps 185 that are electrically connected to a plurality of the contact pads 179 that are exposed through the passivation layer 183 are formed.

Each of the plurality of bumps 185 has a stacked structure including the first metal layer 185A and the second metal layer 185B. In some embodiments, the first metal layer 185A is formed of Cu, Ni, or an alloy thereof. In some embodiments, the second metal layer 185B is formed of tin (Sn), silver (Ag), lead (Pb), gold (Au), Cu, bismuth (Bi), or an alloy thereof. For example, the second metal layer 185B may be formed of an alloy of Sn and Ag. The first metal layer 185A and the second metal layer 185B may be formed by sequentially performing electroplating and reflow.

The plurality of bumps 185 may further include a seed layer (not shown) that is disposed between the contact pad 179 and the first metal layer 185A. The seed layer may have a stacked structure formed of Ti/Cu or TiW/Cu. The seed layer may be used in order to form the first metal layer 185A by using electroplating.

Referring to FIG. 6G, an adhesive coating layer 186 is applied to a surface of the substrate 110 including the plurality of bumps 185, and the substrate 110 including the plurality of bumps 185 is mounted on a wafer support substrate 188 by using the adhesive coating layer 186 as an adhesive material.

A backlapped back side 110D is exposed by performing backlapping to a predetermined thickness on a bottom surface of the substrate 110 which is opposite to a side of the substrate 110 that is covered by the wafer support substrate 188.

Referring to FIG. 6H, a hard mask layer 622 is formed on the back side 110D of the substrate 110, and then a mask pattern 624 is formed on the hard mask layer 622. At least one hole 624H through which a part of a top surface of the hard mask layer 622 is exposed is formed in the mask pattern 624 in the TSV region.

The hard mask layer 622 may be formed of, for example, a silicon nitride film. The hard mask layer 622 may be formed to have a thickness ranging from about 200 Å to about 1000 Å. The mask pattern 624 may be formed of, for example, a photoresist material.

Referring to FIG. 6I, a hard mask pattern 622P is formed by etching the hard mask layer 622 by using the mask pattern 624 (see FIG. 6H) as an etching mask, and the via hole H through which the TSV landing pad 650 is exposed is formed by etching the substrate 110 by using the mask pattern 624 and the hard mask pattern 622P as an etching mask. The via hole H extends by passing through the substrate 110, the interlayer insulating film 124 of the FEOL structure 120, and the etch-stop layer 126.

Anisotropic etching or laser drilling may be used in order to form the via hole H. A part of the TSV landing pad 650 may be etched due to overetching during an etching process for forming the via hole H, to expose a recessed surface 650R of the TSV landing pad 650 through a bottom surface of the via hole H. A width and a depth of the via hole H are not limited to those in FIG. 6I, and may be any of various sizes as desired.

One of important things to consider in a process of forming the via hole H is that when the via hole H is formed to pass through the substrate 110 that has a thickness of tens of μm, the interlayer insulating film 124 of the FEOL structure 120 that is formed on the substrate 110, and the etch-stop layer 126, it is necessary to control the amount of the substrate 110, the interlayer insulating film 124, and the etch-stop layer 126 that are etched in order to expose the TSV landing pad 650 through a plurality of the via holes H that are formed over all portions of the substrate 110. However, after an etching process for forming the plurality of via holes H from the back side 110D of the substrate 110 is performed, at least parts of the substrate 110, the interlayer insulating film 124, and the etch-stop layer 126 may not be removed and may remain on the TSV landing pad 650 that is exposed through the plurality of via holes H, and thus may have different thicknesses on the substrate 110. As a result, there may exist a portion of the TSV landing pad 650 which is not exposed through the via holes H. For example, when a thickness variation reaches several to tens of μm, the TSV landing pad 650 and conductive landing pads that are formed at different positions to correspond to the TSV landing pad 650 may need to be overetched until the TSV landing pad 650 and the conductive landing pads are exposed through all of the via holes H. In these embodiments, if a thickness of a TSV landing pad which needs to be exposed through a via hole H is relatively small, the via hole H may be formed by passing through the TSV landing pad due to the overetching, and thus the TSV landing pad may fail to perform its own function. In particular, as an IC device gets smaller and thinner and wirings get thinner, a technical difficulty of a process of forming the via hole H through which the TSV landing pad is exposed greatly increases.

According to some embodiments of the present inventive concept, however, the TSV landing pad 650 has a stacked structure including the first pad layer 652 and the second pad layer 654 that are formed at the same time as the first multi-layer wiring structures 640 is formed in the MC region. Accordingly, a total thickness of the TSV landing pad 650 may be sufficiently large for the TSV landing pad 650 to remain without being removed even during overetching for exposing the TSV landing pad 650 when the via holes H are formed. For example, the TSV landing pad 650 may be formed to have a relatively large thickness of at least 100 nm, for example, a thickness ranging from about 100 nm to about 500 nm. Accordingly, even when overetching is performed until the TSV landing pad 650 is exposed through all of the via holes H that are formed in the substrate 110 during an etching process for forming the via holes H, deformation great enough to substantially affect the function of the TSV landing pad 650 does not occur. Accordingly, a problem caused by a variation during an etching process, which may occur when the plurality of via holes H is formed in the substrate 110, may be reduced or possibly prevented.

After each of the via holes H is formed in a process of FIG. 6I, a top surface of the hard mask pattern 622P is exposed by removing the mask pattern 624 (see FIG. 6H).

Referring to FIG. 6J, the via insulating film 186 that covers an inner side wall of the via hole H is formed. In order to form the via insulating film 186, an insulating film that covers an inner wall of the via hole H and the back side 110D of the substrate 110 may be formed by using chemical vapor deposition (CVD), and then a portion of the insulating film may be removed to expose the TSV landing pad 650 in the via hole H. Anisotropic ion etching may be used in order to remove the portion of the insulating film. The via insulating film 186 may be a silicon oxide film.

Referring to FIG. 6K, the conductive barrier film 184 is formed in the via hole H, and a TSV forming conductive layer 182P is formed on the conductive barrier film 184. The conductive barrier film 184 is formed to cover the via insulating film 186 and the TSV landing pad 650 that are exposed in the via hole H. In FIG. 6K, the conductive barrier film 184 is formed on the hard mask pattern 622P to extend to the outside of the via hole H. However, it will be understood that embodiments of the inventive concept are not limited thereto. For example, the conductive barrier film 184 may be formed only in the via hole H. Also, the conductive barrier film 184 is formed to cover a top surface of the TSV landing pad 650 in FIG. 6K. However, the inventive concept is not limited thereto. In some embodiments, at least a portion of the top surface of the TSV landing pad 650 may not be covered by the conductive barrier film 184. Alternatively, as shown in FIG. 2A, the conductive barrier film 184 may be formed only on a side wall of the via insulating film 186 which is exposed in the via hole H.

In order to form the TSV forming conductive layer 182P, a seed layer may be first formed on the conductive barrier film 184. The seed layer may be formed to cover the conductive barrier film 184 inside and outside the via hole H. The seed layer may have a stacked structure formed of Ta/Cu or Ti/Cu. The seed layer may be formed by using PVD. The TSV forming conductive layer 182P may be formed by using electroplating using the seed layer. The TSV forming conductive layer 182P is formed on the conductive barrier film 184 to have a thickness great enough to fill the via hole H. In some embodiments, the TSV forming conductive layer 182P is formed of Cu. For example, in order to form the TSV forming conductive layer 182P, a Cu film may be formed from a surface of the seed layer by using electroplating.

Alternatively, the TSV forming conductive layer 182P may be formed of W or Al. In these embodiments, the seed layer may be omitted. For example, the TSV forming conductive layer 182P may be directly formed on the conductive barrier film 184 by using PVD.

Referring to FIG. 6L, a resultant structure including the TSV forming conductive layer 182P is polished until the back side 110D of the substrate 110 is exposed, so that the conductive barrier film 184 and the TSV forming conductive layer 182P remain only in the via hole H. As a result, the TSV structure 180 including the conductive plug 182 of the TSV forming conductive layer 182P which remains in the via hole H, and the conductive barrier film 184 that surrounds the conductive plug 182 is obtained.

Processing steps in the fabrication of IC devices 400 including the TSV landing pad 650 having a similar structure to that of the TSV landing pad 150 of the IC device 100 of FIG. 2A has been described with reference to FIGS. 6A through 6L. The IC device 200 including the TSV landing pad 250 of FIG. 3A, the IC device 300A including the TSV landing pad 350 of FIG. 5A, and the IC device 300B including the TSV landing pad 450 of FIG. 5B may be easily formed by using processes described with reference to FIGS. 6A through 6L within the scope of the inventive concept, and thus details thereof will not be repeated herein in the interest of brevity.

Figure 7:
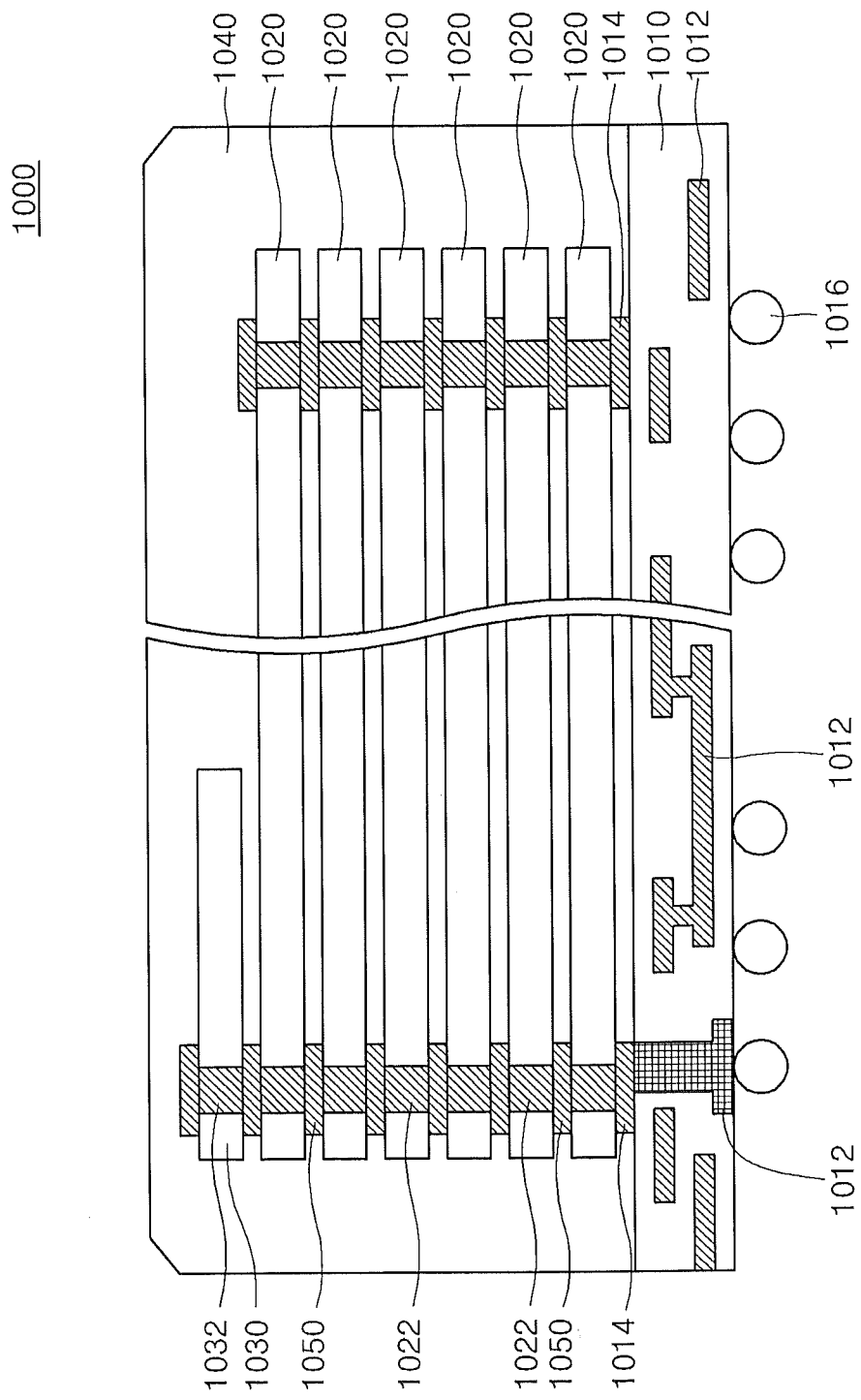
FIG. 7 is a cross-section illustrating portions of an IC device according to some embodiments of the inventive concept.

Referring to FIG. 7, a cross-section illustrating a portion of the IC device 1000 according to some embodiments of the inventive concept will be discussed. As illustrated in FIG. 7, the IC device 1000 includes a plurality of semiconductor chips 1020 that are sequentially stacked on a package substrate 1010. A control chip 1030 is connected to the plurality of semiconductor chips 1020. A stacked structure including the plurality of semiconductor chips 1020 and the control chip 1030 is sealed by an encapsulant 1040 such as a thermosetting resin on the package substrate 1010. Although 6 semiconductor chips 1020 are vertically stacked in FIG. 7, the number of the semiconductor chips 1020 and directions in which the semiconductor chips 1020 are stacked are not limited thereto. The number of the semiconductor chips 1020 may be more or less than 6 without departing from the scope of the inventive concept. The plurality of semiconductor chips 1020 may be disposed in a horizontal direction on the package substrate 1010, or may be disposed in a combination of horizontal and vertical directions. The control chips 1020 may be omitted.

The package substrate 1010 may be a flexible printed circuit board (PCB), a rigid PCB, or a combination thereof. The package substrate 1010 includes an internal wiring 1012 and a connection terminal 1014. The connection terminal 1014 may be formed on one surface of the package substrate 1010. Solder balls 1016 are formed on the other surface of the package substrate 1010. The connection terminal 1014 is electrically connected to the solder balls 1016 through the internal wiring 1012. The solder balls 1016 may be replaced by conductive bumps or a lead grid array (LGA).

At least one of the plurality of semiconductor chips 1020 and the control chip 1030 include at least one of the IC devices 10, 100, 200, 300A, 300B, and 400 described with reference to FIGS. 1 through 6L.

TSV connection structures 1022 and 1032 of the plurality of semiconductor chips 1020 and the control chip 1030 may be electrically connected to the connection terminal 1014 of the package substrate 1010 through a connection member 1050.

The plurality of semiconductor chips 1020 may include a system LSI, a flash memory, a dynamic random-access memory (DRAM), a static random-access memory (SRAM), an electrically erasable programmable read-only memory (EEPROM), a parallel random-access memory (PRAM), a magnetoresistive random-access memory (MRAM), or a resistive random-access memory (RRAM). The control chip 1030 may include logic circuits such as a serializer/deserializer (SER/DES).

Figure 8:
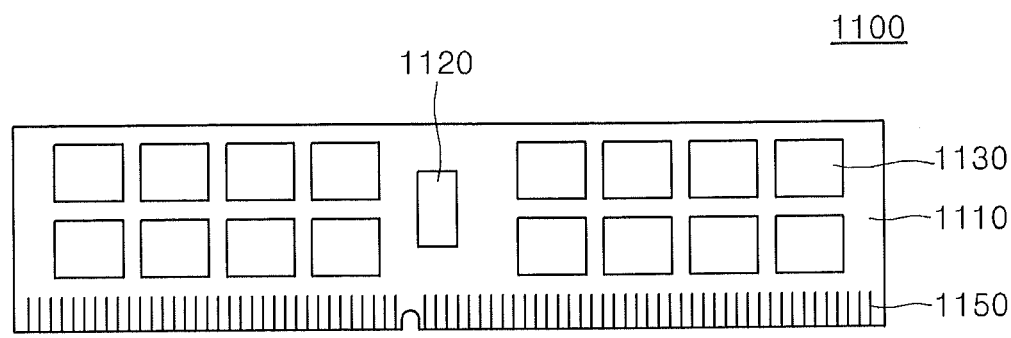
FIG. 8 is a plan view illustrating portions of an IC device according to some embodiments of the inventive concept.

Referring to FIG. 8, a plan view illustrating portions of an IC device 1100 according to some embodiments of the inventive concept will be discussed. As illustrated therein, the IC device 1100 includes a module substrate 1110, a control chip 1120 that is mounted on the module substrate 1110, and a plurality of semiconductor packages 1130. A plurality of input/output terminals 1150 are formed on the module substrate 1110.

The plurality of semiconductor packages 1130 include at least one of the IC devices 10, 100, 200, 300A, 300B, and 400 described with reference to FIGS. 1 through 6L.

Figure 9:
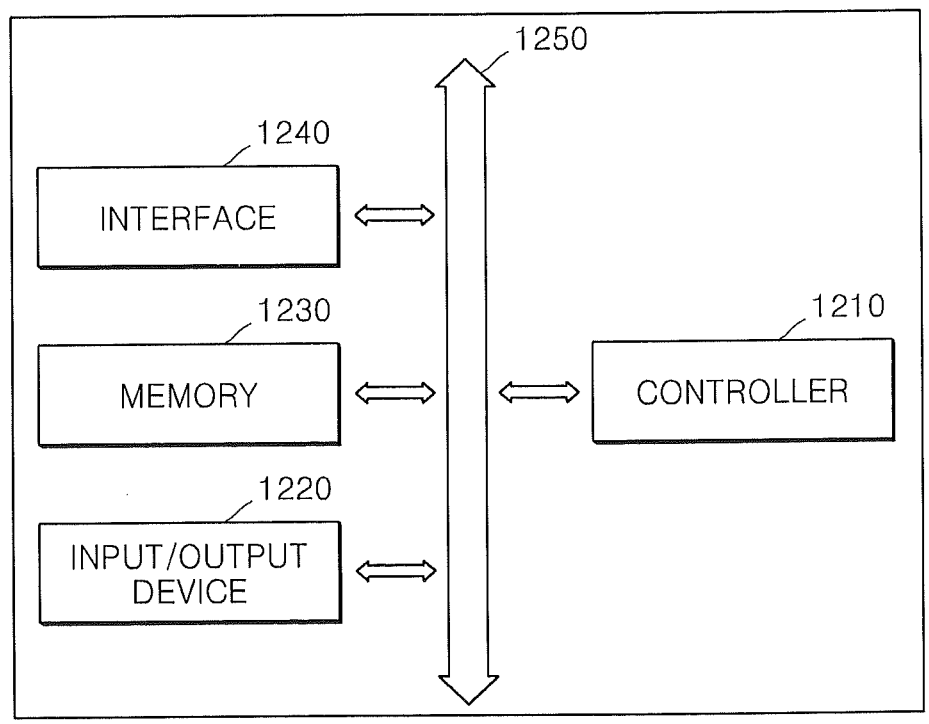
FIG. 9 is a block diagram illustrating portions of an IC device according to some embodiments of the inventive concept.

Referring now to FIG. 9, a block diagram illustrating portions of an IC device 1200 according to some embodiments of the present inventive concept will be discussed. The IC device 1200 includes a controller 1210, an input/output device 1220, a memory 1230, and an interface 1240. The IC device 1200 may be a mobile system or a system that transmits or receives information. The mobile system may be at least one of a personal digital assistant (PDA), a mobile computer, a web tablet, a wireless phone, a mobile phone, a digital music player, and a memory card. The controller 1210 may be a microprocessor, a digital signal processor, or a microcontroller.

The input/output device 1220 is used to input/output data of the IC device 1200. The IC device 1200 may be connected to an external device, for example, a personal computer (PC) or a network, by using the input/output device 1220, and may exchange data with the external device. In some embodiments, the input/output device 1220 is a keypad, a keyboard, or a display unit.

In some embodiments, the memory 1230 stores code and/or data for operating the controller 1210. Alternatively, the memory 1230 stores data processed by the controller 1210. At least one of the controller 1210 and the memory 1230 includes at least one of the IC devices 10, 100, 200, 300A, 300B, and 400 described with reference to FIGS. 1 through 6L.

The interface 1240 functions as a path through which data is transmitted between the IC device 1200 and the external device. The controller 1210, the input/output device 1220, the memory 1230, and the interface 1240 may communicate with one another via a bus 1250.

The IC device 1200 may be included in a mobile phone, an MP3 player, a navigation system, a portable multimedia player (PMP), a solid-state disk (SSD), or a household appliance.

In an IC device according to some embodiments of the inventive concept, a TSV landing pad that is formed on a substrate to be connected to a TSV structure that passes through the substrate has a multi-layer structure that is formed on the substrate at the same level as at least two layers selected from a plurality of wiring layers, a plurality of contact plugs, or a combination thereof that have different distances from the substrate from among multi-layer wiring structures, and is formed of the same material as those of the at least two layers. Since the TSV landing pad having the multi-layer structure has a relatively large thickness, the likelihood that a problem caused by a variation during an etching process which may occur when a plurality of via holes that pass through the substrate are formed in order to form the TSV structure will occur may be reduced or may possibly be prevented.

As briefly discussed above, some embodiments of the inventive concept provide integrated circuit (IC) devices having a reliable wiring connection structure between a multi-layer wiring structure that is formed on a substrate and a through-silicon via (TSV) structure that passes through the substrate. Related fabrication methods are also provided.

While the inventive concept has been particularly shown and described with reference to exemplary embodiments thereof, it will be understood that various changes in form and details may be made therein without departing from the spirit and scope of the following claims.

What is claimed is:

1. An integrated circuit (IC) device comprising:
   a first multi-layer wiring structure comprising a plurality of first wiring layers in a first region of a substrate at different levels and spaced apart from one another, and a plurality of first contact plugs between the plurality of first wiring layers and configured connect the plurality of first wiring layers;
   a through-silicon via (TSV) landing pad comprising a first pad layer in a second region of the substrate at a same level as that of at least one first wiring layer from among the plurality of first wiring layers, and a second pad layer at a same level as that of at least one first contact plug from among the plurality of first contact plugs and configured to contact the first pad layer;
   a second multi-layer wiring structure on the TSV landing pad; and
   a TSV structure that passes through the substrate and is connected to the second multi-layer wiring structure through the TSV landing pad.

2. The IC device of claim 1, wherein a width of the second pad layer in a direction parallel to a main surface extension direction of the substrate is greater than a width of the at least one first contact plug.

3. The IC device of claim 1, wherein a width of the first pad layer and a width of the second pad layer in a direction parallel to a main surface extension direction of the substrate are different from each other.

4. The IC device of claim 1, wherein each of the first pad layer and the second pad layer comprises a metal layer and a conductive barrier film that surrounds at least a portion of the metal layer.

5. The IC device of claim 1, wherein the TSV landing pad further comprises a third pad layer that is connected to the second pad layer to vertically overlap the first pad layer and is formed at a same level as that of any one first wiring layer from among the plurality of first wiring layers.

6. The IC device of claim 5, wherein a width of the third pad layer in a direction parallel to a main surface extension direction of the substrate is less than a width of the second pad layer.

7. The IC device of claim 5, wherein the third pad layer comprises a metal layer, and a conductive barrier film that surrounds at least a portion of the metal layer.

8. The IC device of claim 1, further comprising:
   an insulating film in the second region between the substrate and the TSV landing pad,
   wherein the TSV structure passes through the substrate and the insulating film and is connected to the TSV landing pad.

9. The IC device of claim 1, wherein the TSV landing pad extends in the second region of the substrate in a first area, wherein the TSV structure is connected in the second region of the substrate to the TSV landing pad in a second area that is included in the first area.

10. The IC device of claim 1, wherein the TSV structure has a top surface that contacts the TSV landing pad, wherein only a portion of the top surface contacts the TSV landing pad.

11. The IC device of claim 1, wherein at least a portion of the TSV landing pad has a mesh pattern.

12. The IC device of claim 1, wherein at least a portion of the TSV landing pad has a plurality of patterns that are spaced apart from one another.

13. The IC device of claim 1, wherein the second multi-layer wiring structure comprises:
    a plurality of second wiring layers that are formed at different levels and spaced apart from one another; and
    a plurality of second contact plugs that are connected from any one second wiring layer from among the plurality of second wiring layers to the TSV landing pad and are spaced apart from one another.

14. An integrated circuit (IC) device comprising:
    a substrate including a memory cell array region and a through-silicon via (TSV) region;
    a multi-layer wiring structure on the substrate in the memory cell array region;
    a TSV landing pad on the substrate in the TSV region, the TSV region having a multi-layer structure; and
    a TSV structure that passes through the substrate in the TSV region and is connected to the TSV landing pad,
    wherein the multi-layer wiring structure comprises a plurality of first wiring layers that are spaced apart from one another to vertically overlap with one another, and a plurality of contact plugs between the plurality of first wiring layers and connect the plurality of first wiring layers, and
    wherein the TSV landing pad comprises a first pad layer on the substrate at a same level as that of at least one wiring layer from among the plurality of wiring layers, and a second pad layer at a same level as that of at least one contact plug from among the plurality of contact plugs and contacts the first pad layer.

15. The IC device of claim 14, wherein each of the first pad layer and the second pad layer has a width that is greater than a width of the TSV structure in a direction parallel to a main surface extension direction of the substrate.

* * * * *